(12) United States Patent
Zhang

(10) Patent No.: US 12,412,855 B2
(45) Date of Patent: Sep. 9, 2025

(54) VERTICAL MEMORY DEVICES

(71) Applicant: Yangtze Memory Technologies Co., Ltd., Hubei (CN)

(72) Inventor: Kun Zhang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 18/593,467

(22) Filed: Mar. 1, 2024

(65) Prior Publication Data

US 2024/0250050 A1    Jul. 25, 2024

Related U.S. Application Data

(60) Division of application No. 17/113,605, filed on Dec. 7, 2020, now Pat. No. 11,948,901, which is a
(Continued)

(51) Int. Cl.
*H01L 25/065* (2023.01)
*H01L 23/00* (2006.01)
(Continued)

(52) U.S. Cl.
CPC .............. *H01L 24/08* (2013.01); *H01L 24/80* (2013.01); *H01L 25/0657* (2013.01);
(Continued)

(58) Field of Classification Search
CPC ..... H01L 24/08; H01L 24/80; H01L 25/0657; H01L 25/18; H01L 25/50;
(Continued)

(56) References Cited

U.S. PATENT DOCUMENTS 9,847,341 B2    12/2017    Shin et al.
10,032,787 B2    7/2018    Shin et al.
(Continued)

FOREIGN PATENT DOCUMENTS

CN           104681561 A     6/2015
CN    10-2018-0007811 A     1/2018
(Continued)

OTHER PUBLICATIONS

Singapore Search Report issued on Feb. 20, 2023, in the Singapore Application No. 11202112524S, 2 pages.
(Continued)

*Primary Examiner* — Thanh Y. Tran
(74) *Attorney, Agent, or Firm* — Oblon, McClelland, Maier &Neustadt, L.L.P.

(57) ABSTRACT

Aspects of the disclosure provide a semiconductor device and method. An example method include forming a stack of layers on a substrate, the stack of layers including a source sacrificial layer, a conductive layer, gate sacrificial layers and insulating layers; forming a staircase into the stack of layers in a staircase region that is adjacent to an array region; forming channel structures in the array region, a channel structure including a channel layer surrounded by one or more insulating layers and extending into the stack of layers; replacing the source sacrificial layer with a source layer in conductive connection with the channel layer, the source layer and the conductive layer forming a common source layer; replacing the gate sacrificial layers with gate layers; and forming a first contact structure in the staircase region, the first contact structure forming a conductive connection with the common source layer.

20 Claims, 14 Drawing Sheets

Related U.S. Application Data continuation of application No. PCT/CN2020/093112, filed on May 29, 2020.

(51) Int. Cl.
  *H01L 25/00* (2006.01)
  *H01L 25/18* (2023.01)
  *H10B 41/27* (2023.01)
  *H10B 43/27* (2023.01)

(52) U.S. Cl.
  CPC .............. *H01L 25/18* (2013.01); *H01L 25/50* (2013.01); *H10B 41/27* (2023.02); *H10B 43/27* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
  CPC . H01L 2224/08145; H01L 2224/80895; H01L 2224/80896; H01L 2924/1431; H01L 2924/14511; H01L 2224/05547; H10B 41/27; H10B 43/27; H10B 43/40
  See application file for complete search history.

(56) References Cited

U.S. PATENT DOCUMENTS

| | | |
|---|---|---|
| 10,516,025 B1 | 12/2019 | Nishikawa et al. |
| 10,600,763 B1 | 3/2020 | Xiao |
| 10,608,010 B2 | 3/2020 | Terasawa et al. |
| 10,818,678 B2 | 10/2020 | Hwang et al. |
| 2009/0096062 A1 | 4/2009 | Bang |
| 2015/0145015 A1 | 5/2015 | Shin et al. |
| 2016/0268290 A1 | 9/2016 | Matsunaga et al. |
| 2017/0317096 A1 | 11/2017 | Shin et al. |
| 2019/0035798 A1 | 1/2019 | Hwang et al. |
| 2019/0043868 A1 | 2/2019 | Hasnat et al. |
| 2019/0280001 A1 | 9/2019 | Terasawa et al. |
| 2019/0386108 A1* | 12/2019 | Nishikawa ......... H10D 30/6894 |
| 2020/0350321 A1 | 11/2020 | Cheng et al. |
| 2021/0233900 A1* | 7/2021 | Kim .................. H01L 25/50 |
| 2022/0028888 A1 | 1/2022 | Zhang et al. |

FOREIGN PATENT DOCUMENTS

| | | |
|---|---|---|
| CN | 109983577 A | 7/2019 |
| CN | 110192269 A | 8/2019 |
| CN | 110785851 A | 2/2020 |
| CN | 110870062 A | 3/2020 |
| CN | 111370423 A | 7/2020 |
| JP | 8-186235 A | 7/1996 |
| JP | 8-227980 A | 9/1996 |
| JP | 2017-511978 A | 4/2017 |
| JP | 2017-532767 A | 11/2017 |
| JP | 2018-160531 A | 10/2018 |
| JP | 2019-165135 A | 9/2019 |
| KR | 10-2015-0081393 A | 7/2015 |
| KR | 10-2015-0133914 A | 12/2015 |
| TW | 201913966 A | 4/2019 |
| TW | 202010052 A | 3/2020 |
| TW | 202013684 A | 4/2020 |
| WO | WO 2018/194750 A1 | 10/2018 |

OTHER PUBLICATIONS

European Office Action issued on Mar. 13, 2023, in the European Application No. 20 920 028.8, 9 pages.
Japanese Office Action issued on Feb. 28, 2023, in the Japanese Application No. 2021-572928, 6 pages.
Korean Office Action issued on Feb. 23, 2023, in the Korean Application No. 10-2021-7007807, 7 pages.
Supplementary European Search Report issued on Sep. 1, 2022 in European Patent Application No. 20 93 6072, 8 pages.
International Search Report issued Mar. 1, 2021 in PCT/CN2020/093112, 4 pages.
Office Action dated May 26, 2025, issued in Chinese Application No. 202111004045.2 (with computer-generated English translation).

* cited by examiner

VERTICAL MEMORY DEVICES

CROSS-REFERENCE TO RELATED APPLICATIONS

This application is a divisional of U.S. application Ser. No. 17/113,605, filed on Dec. 7, 2020, which is a continuation of International Application No. PCT/CN2020/093112, filed on May 29, 2020, all of which are incorporated by reference in their entireties.

BACKGROUND

Semiconductor manufactures developed vertical device technologies, such as three dimensional (3D) NAND flash memory technology, and the like to achieve higher data storage density without requiring smaller memory cells. In some examples, a 3D NAND memory device includes a core region and a staircase region. The core region includes a stack of alternating gate layers and insulating layers. The stack of alternating gate layers and insulating layers is used to form memory cells that are stacked vertically. The staircase region includes the respective gate layers in the stair-step form to facilitate forming contacts to the respective gate layers. The contacts are used to connect driving circuitry to the respective gate layers for controlling the stacked memory cells.

SUMMARY

Aspects of the disclosure provide a semiconductor device. The semiconductor device includes a stack of layers. The stack of layers includes a common source layer, gate layers and insulating layers disposed on a substrate. The gate layers and insulating layers are stacked alternatingly. Then, the semiconductor device includes an array of channel structures formed in an array region. The channel structure extends through the stack of layers and forms a stack of transistors in a series configuration. The channel structure includes a channel layer that is in contact with the common source layer. The common source layer extends over the array region and a staircase region. The semiconductor device includes a contact structure disposed in the staircase region. The contact structure forms a conductive connection with the common source layer.

In some embodiments, the common source layer includes a metal silicon compound layer and a silicon layer. The metal silicon compound layer includes at least one of titanium (Ti), cobalt (Co), nickel (Ni), and platinum (Pt).

According to an aspect of the disclosure, the semiconductor device includes a gate line cut structure with a bottom conductive layer in conductive connection with the common source layer. In some embodiments, the gate line cut structure includes an upper insulating portion that is above the bottom conductive layer. In an embodiment, the bottom conductive layer comprises a metal silicon compound layer.

In an embodiment, the array region is a first array region in a block, and the contact structure is disposed in the staircase region that is located between the first array region and a second array region in the block.

In another embodiment, the contact structure is a first contact structure, and the staircase region is a first staircase region located on a first side of the array region. The semiconductor device further includes a second contact structure disposed in a second staircase region that is located at a second side of the array region that is opposite to the first side of the array region. The common source layer extends over the second staircase region, and the second contact structure is conductively connected with the common source layer.

In some embodiments, the substrate is a first substrate having a face side and a back side, the channel structures are formed on the face side of the substrate. The semiconductor device further includes a second substrate having a face side and a back side. Transistors can be formed on the face side of the second substrate. The second substrate has bonding structures on the face side to be aligned and bonded with corresponding bonding structures on the face side of the first substrate. In some examples, the semiconductor device has contact pads disposed on the back side of the first substrate. In some other examples, the semiconductor device has contact pads disposed on the back side of the second substrate.

Aspects of the disclosure provide a method for fabricating a semiconductor device. The method includes forming a stack of layers on a substrate. The stack of layers includes a source sacrificial layer, a conductive layer, gate sacrificial layers and insulating layers. Further, the method includes forming a staircase into the stack of layers in a staircase region that is adjacent to an array region, and forming channel structures in the array region, a channel structure including a channel layer surrounded by one or more insulating layers and extending into the stack of layers. Then, the method includes replacing the source sacrificial layer with a source layer in conductive connection with the channel layer, and replacing the gate sacrificial layers with gate layers. The source layer and the conductive layer form a common source. The method further includes forming a first contact structure in the staircase region structure, the first contact structure forming a conductive connection with the common source.

In some embodiments, the method includes etching a gate line cut trench into the stack of layer with the conductive layer being an etch stop layer. Further, the method includes replacing, through the gate line cut trench, the source sacrificial layer with the source layer, forming a silicide layer with the source layer at a bottom of the gate line cut trench and filling the gate line cut trench with insulating material.

In some embodiments, the method includes etching a contact hole corresponding to the first contact structure, with the conductive layer being an etch stop layer.

In some examples, the method includes forming the first contact structure based on a mask including a first pattern for the first contact structure and a second pattern for forming a second contact structure to a gate layer. Further, the method includes forming a second contact structure at a border of an erase block away from array regions of the erase block. In an example, the method includes connecting the first contact structure with other contact structures to the common source using metal wires that are routed away from the array region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
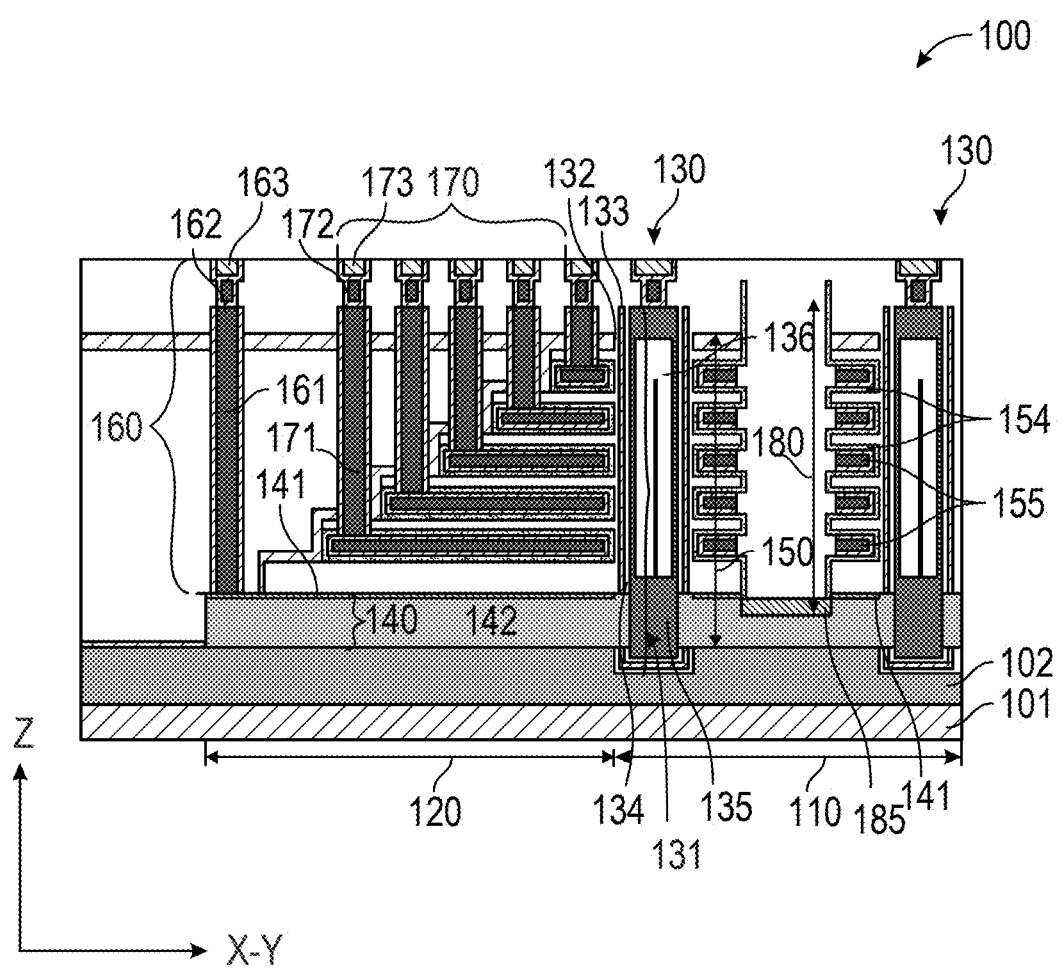
FIG. 1 shows a cross-sectional view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide an array common source (ACS) technology for a vertical memory device and an ACS contact technology for connecting ACS to peripheral circuitry. Specifically, in some embodiments, a high conductive layer, such as a metal layer, a metal compound layer, a metal silicide layer and the like, is formed in connection with sources of vertical memory cell strings. The vertical memory cell strings are formed as arrays in a core region and the high conductive layer extends in the core region and forms an array common source (ACS) with relatively high current conductivity. The high conductive layer further extends into a connection region. The connection region includes a staircase structure that is used to form connections to gates of the vertical memory cell strings. A contact structure to the high conductive layer can be formed in the connection region. The contact structure can be used to interconnect the ACS with other circuitry, such as peripheral circuitry for the vertical memory device.

According to an aspect of the disclosure, the ACS and ACS contact technologies disclosed in the present disclosure can achieve various benefits over a related example. For example, the related example forms ACS structures for vertical memory cell strings in gate line cut structures, and uses conductive wires above the core region to interconnect contacts of the ACS structures for current distribution. In the related example, the area beneath the conductive wires (that interconnect the contacts of the ACS structures) in the core region is not desirable for operations of vertical memory cell strings. The present disclosure uses the high conductive layer to form ACS and distribute current, and uses contact structures in the connection region to connect the ACS to peripheral circuitry, thus area in the core region can be efficiently used for forming vertical memory cell strings. Then, for the same amount of memory bytes, the present disclosure can achieve smaller core region compared to the related example. Other benefits will be described further in the description.

FIG. 1 shows a cross-sectional view of a semiconductor device 100 according to some embodiments of the disclosure. The semiconductor device 100 includes a substrate 101, and circuits formed on the thereupon. For simplicity, the main surface of the substrate 101 is referred to as an X-Y plane, and the direction perpendicular to the main surface is referred to as Z direction.

The semiconductor device 100 refers to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like. The substrate 101 can be any suitable substrate, such as a silicon (Si) substrate, a germanium (Ge) substrate, a silicon-germanium (SiGe) substrate, and/or a silicon-on-insulator (SOI) substrate. The substrate 101 may include a semiconductor material, for example, a Group IV semiconductor, a Group III-V compound semiconductor, or a Group II-VI oxide semiconductor. The Group IV semiconductor may include Si, Ge, or SiGe. The substrate 101 may be a bulk wafer or an epitaxial layer. In the FIG. 1 example, a well 102 is formed on the substrate 101, the well 102 can be N-type doped polysilicon or P-type doped polysilicon. For example, in the example that P-type well is used, the P-type well is the body portion for memory cell strings, and can provide holes during erase operation using body erase mechanism. During read operation, an array common source (will be described in detail) can drive electrons to channels during the read operation. In another example that N-type well is used, a gate induced drain leakage (GIDL) erase mechanism can be used in the erase operation. Specifically, a high field is applied on a P-N junction, and generates holes due to band-to-band tunneling.

In various embodiments, the semiconductor device 100 includes three dimensional (3D) NAND memory circuitry formed on the substrate 101. The semiconductor device 100 can include other suitable circuitry (not shown), such as logic circuitry, power circuitry, and the like that is formed on the substrate 101, or other suitable substrate, and is suitably coupled with the 3D NAND memory circuitry. Generally, the 3D NAND memory circuitry includes memory cell arrays and peripheral circuitry (e.g., address decoder, driving circuits, sense amplifier and the like). A memory cell array is formed in a core region 110 as an array of vertical memory cell strings. The peripheral circuitry is formed in a peripheral region (not shown). Besides the core region 110 and the peripheral region, the semiconductor device 100 includes a staircase region 120 (also referred to as a connection region in some examples) to facilitate making connections to, for example, gates of the memory cells in the vertical memory cell strings. The gates of the memory cells in the vertical memory cell strings correspond to word lines for the NAND memory architecture.

In the example of FIG. 1, vertical memory cell strings 130 are shown as representation of an array of vertical memory cell strings formed in the core region 110. The vertical memory cell strings 130 are formed in a stack of layers 150. The stack of layers 150 includes gate layers 155 and insulating layers 154 that are stacked alternatingly. The gate layers 155 and the insulating layers 154 are configured to form transistors that are stacked vertically. In some examples, the stack of transistors includes memory cells and select transistors, such as one or more bottom select transistors, one or more top select transistors and the like. In some examples, the stack of transistors can include one or more dummy select transistors. The gate layers 155 correspond to gates of the transistors. The gate layers 155 are made of gate stack materials, such as high dielectric constant (high-k) gate insulator layers, metal gate (MG) electrode, and the like. The insulating layers 154 are made of insulating material(s), such as silicon nitride, silicon dioxide, and the like.

According to some aspects of the disclosure, the vertical memory cell strings are formed of channel structures 131 that extend vertically (Z direction) into the stack of layers 150. The channel structures 131 can be disposed separate from each other in the X-Y plane. In some embodiments, the channel structures 131 are disposed in the form of arrays between gate line cut structures 180 (also referred to as gate line slit structures in some examples). The gate line cut structures 180 are used to facilitate replacement of sacrificial layers with the gate layers 155 in a gate-last process. The arrays of the channel structures 131 can have any suitable array shape, such as a matrix array shape along the X direction and the Y direction, a zig-zag array shape along the X or Y direction, a beehive (e.g., hexagonal) array shape, and the like. In some embodiments, each of the channel structures has a circular shape in the X-Y plane, and a pillar shape in the X-Z plane and Y-Z plane. In some embodiments, the quantity and arrangement of the channel structures between gate line cut structures is not limited.

As shown in the FIG. 1 example, a vertical memory cell string 130 is formed of a channel structure 131. In some embodiments, the channel structure 131 has a pillar shape that extends in the Z direction that is perpendicular to the direction of the main surface of the substrate 101. In an embodiment, the channel structure 131 is formed by materials in the circular shape in the X-Y plane, and extends in the Z direction. For example, the channel structure 131 includes function layers, such as a blocking insulating layer 132 (e.g., silicon oxide), a charge storage layer (e.g., silicon nitride) 133, a tunneling insulating layer 134 (e.g., silicon oxide), a semiconductor layer 135, and an insulating layer 136 that have the circular shape in the X-Y plane, and extend in the Z direction. In an example, the blocking insulating layer 132 (e.g., silicon oxide) is formed on the sidewall of a hole (into the stack of layers 150) for the channel structure 131, and then the charge storage layer (e.g., silicon nitride) 133, the tunneling insulating layer 134, the semiconductor layer 135, and the insulating layer 136 are sequentially stacked from the sidewall. The semiconductor layer 135 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 136 is formed of an insulating material, such as silicon oxide and/or silicon nitride, and/or may be formed as an air gap.

According to some aspects of the disclosure, the channel structure 131 and the stack of layers 150 together form the memory cell string 130. For example, the semiconductor layer 135 corresponds to the channel portions for transistors in the memory cell string 130, and the gate layers 155 corresponds to the gates of the transistors in the memory cells string 130. Generally, a transistor has a gate that controls a channel, and has a drain and a source at each side of the channel. For simplicity, in the FIG. 1 example, the upper side of the channel for transistors in FIG. 1 is referred to as the drain, and the bottom side of the channel for transistors in FIG. 1 is referred to as the source. It is noted that the drain and the source can be switched under certain driving configurations. In the FIG. 1 example, the semiconductor layer 135 corresponds to connected channels of the transistors. For a specific transistor, the drain of the specific transistor is connected with a source of an upper transistor above the specific transistor, and the source of the specific transistor is connected with a drain of a lower transistor below the specific transistor. Thus, the transistors in the memory cell string 130 are connected in series.

According to some aspects of the disclosure, the bottom portion of the semiconductor layer 135 in the hole corresponds to a source of the vertical memory cell string 130, and a common source layer 140 is formed in conductive connection with the source of the vertical memory cell string 130. The common source layer 140 can includes one or more layers. In the FIG. 1 example, the common source layer 140 includes a high conductive layer 141 and a source layer 142. In some examples, the source layer 142 is silicon material, such as intrinsic polysilicon, doped polysilicon (such as N-type doped silicon, P-type doped silicon) and the like.

Similarly, the common source layer 140 is in conductive connection with sources of other vertical memory cell strings, and thus forms an array common source, and can be referred to as a source connection layer in some examples. In some examples, when the vertical memory cell strings 130 are configured to be erased by block, the common source layer 140 can extend and cover the core regions of a block and staircase regions for the block. In some examples, for different blocks that are erased separately, the common source layer 140 may be suitably insulated for the different blocks.

The high conductive layer 141 is configured to have a relatively large current conductivity and an extensive coverage in the X-Y plane, thus the common source layer 140 can have relatively small resistance and provide relatively efficient current distribution. The high conductive layer 141 can be formed of any suitable material, such as metal, metal compound, metal silicide and the like. In some embodiments, the high conductive layer 141 is formed of a metal silicide that includes metal and silicon (e.g., has a form of $M_xSi_y$), the metal can be any suitable metal, such as titanium (Ti), cobalt (Co), nickel (Ni), platinum (Pt), and the like.

In some embodiments, the bottom portion of the gate line cut structure 180 also includes a high conductive layer 185, such as a metal silicide layer that can be conductively connected with the high conductive layer 141 in some examples. It is noted that the high conductive layer 185 can include the same materials as the high conductive layer 141 or can include different materials from the high conductive layer 141. The high conductive layer 185 is formed in different process steps from the high conductive layer 141. It is noted that, in the FIG. 1 example, the upper portion of the gate line cut structure 180 are filled with insulating material, such as silicon oxide, and the like. Thus, the gate line cut structure 180 is not used for ACS contact in the FIG. 1 example.

In a related example, ACS contact structures are formed in the gate line cut structures and have various issues, such as word line to ACS leakage, a relatively large word line to ACS capacitance, stress during process due to the ACS contact in the gate line cut structures and the like. The present disclosure provides techniques to dispose the ACS contact away from the array region, for example, in the staircase region, around block border or die border, and the like, thus the issues, such as word line to ACS leakage, a relatively large word line to ACS capacitance, stress during process due to the ACS contact in the gate line cut structures and the like can be resolved. For example, the present disclosure can achieve word line to ACS leakage free, no word line to ACS capacitance, and no ACS contact related stress to the array region in some embodiments.

According to an aspect of the disclosure, the common source layer 140 covers extensively in the X-Y plane, and contacts (also referred to as ACS contact in some examples) to the common source layer 140 can be formed in any suitable locations, such as the staircase region, array borders, die borders, and the like. In some embodiments, the contacts to the common source layer 140 can be formed at the same time with other contacts (e.g., word line contacts, bit line contacts and the like) using a same mask, and the high conductive layer 141 can be used as an etch stop layer for the contacts to the common source layer 140. It is noted that in the related example that forms ACS contact in the gate line cut structures, a separate mask (different from a general contact mask) is used with additional process steps to form the ACS contact. Thus, the ACS and ACS contact technologies in the present disclosure have a reduced number of masks.

According to some aspects of the disclosure, due to the use of the high conductive layer 141, the contacts (also referred to as ACS contact) to the common source layer 140 can be disposed with flexibility, and the ACS and ACS contact technologies in the present disclosure can be used with other vertical memory device technologies. In some examples, the ACS and ACS contact technologies disclosed in the present disclosure can be used with various staircase implementations, such as center staircase implementation, side staircase implementation and the like. In some examples, the ACS and ACS contact technologies disclosed in the present disclosure can be used with various pad-out implementations, such as array die side pad-out implementation, CMOS die side contact pad implementation, and the like.

In the FIG. 1 example, an ACS contact structure 160 is configured to connect the common source layer 140 to a driving circuitry (not shown) for source terminals of the vertical memory cell strings. The driving circuitry can provide suitable driving voltages and powers to the ACS (e.g., common source layer 140) during operation.

In the FIG. 1 example, the ACS contact structure 160 includes a contact structure 161, a via structure 162, and a metal wire 163. The contact structure 161, the via structure 162 and the metal wire 163 are conductively coupled together. In some embodiments, the ACS contact structure 160 has similar configuration as the other connection structures, such as word line connection structures 170. For example, as shown in FIG. 1, a word line connection structure 170 includes a contact structure 171, a via structure 172, and metal wire 173 that are conductively coupled together. In some examples, the contact structure 161 can be formed with the contact structure 171 using a same mask, same process steps, and same materials; the via structure 162 can be formed with the via structure 172 using a same mask, same process steps, and same materials; and the metal wire 163 and the metal wire 173 can be formed using a same mask, same process steps, and same materials.

FIGS. 2-5 show some top views for a semiconductor device, such as the semiconductor device 100 according to some embodiments of the disclosure. It is noted that, for ease of illustration, FIGS. 2-5 show a portion of the layers in the semiconductor device, and omit other layers.

Figure 2:
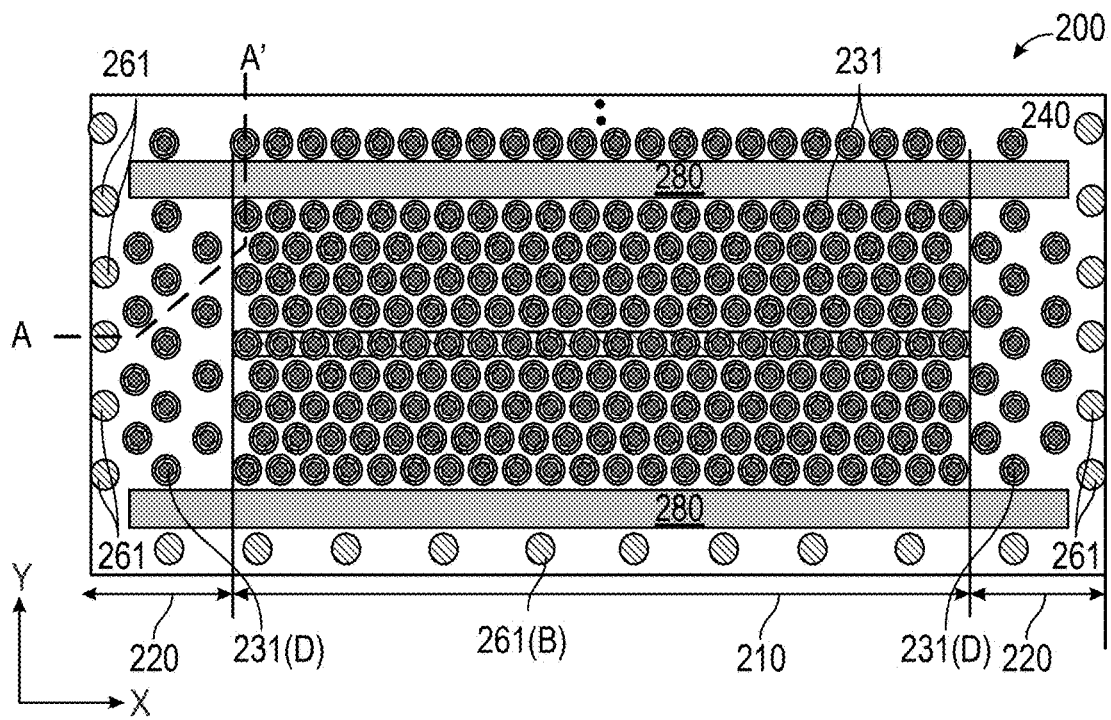
FIG. 2 shows a top view for a semiconductor device according to some embodiments of the disclosure.

FIG. 2 shows a top view 200 for a semiconductor device, such as the semiconductor device 100, according to some embodiments of the disclosure. The top view 200 includes patterns that correspond to top views of some components of the semiconductor device in the X-Y plane. In an example, FIG. 1 is a cross-sectional view of the semiconductor device along A-A' line shown in FIG. 2.

In the FIG. 2 example, the top view 200 includes patterns 280 for gate line cut structures, such as the gate line cut structure 180 in FIG. 1. The patterns 280 have narrow rectangular shapes and are disposed parallel to the X direction. The top view 200 can include a core region 210 (also referred to as array region in some examples) and staircase regions 220 (also referred to as connection regions in some examples) that are disposed at two opposite sides of the core region 210 in the X direction.

The top view 200 includes patterns 231 in the core region 210 for channel structures, such as the channel structures 131 in FIG. 1. The top view 200 also includes patterns 231(D) in the staircase regions 220 for dummy channel structures.

According to some aspects of the disclosure, a common source layer 240 extensively covers the core region 210 and the staircase region 220, and has a high conductive layer (not shown), thus contacts to the common source layer 240 can be disposed with flexibility. In an example, contacts can be disposed in the staircase regions 220 as shown by 261. In another example, contacts can be disposed at a border of the block, such as shown by 261(B) of the top view 200.

Figure 3:
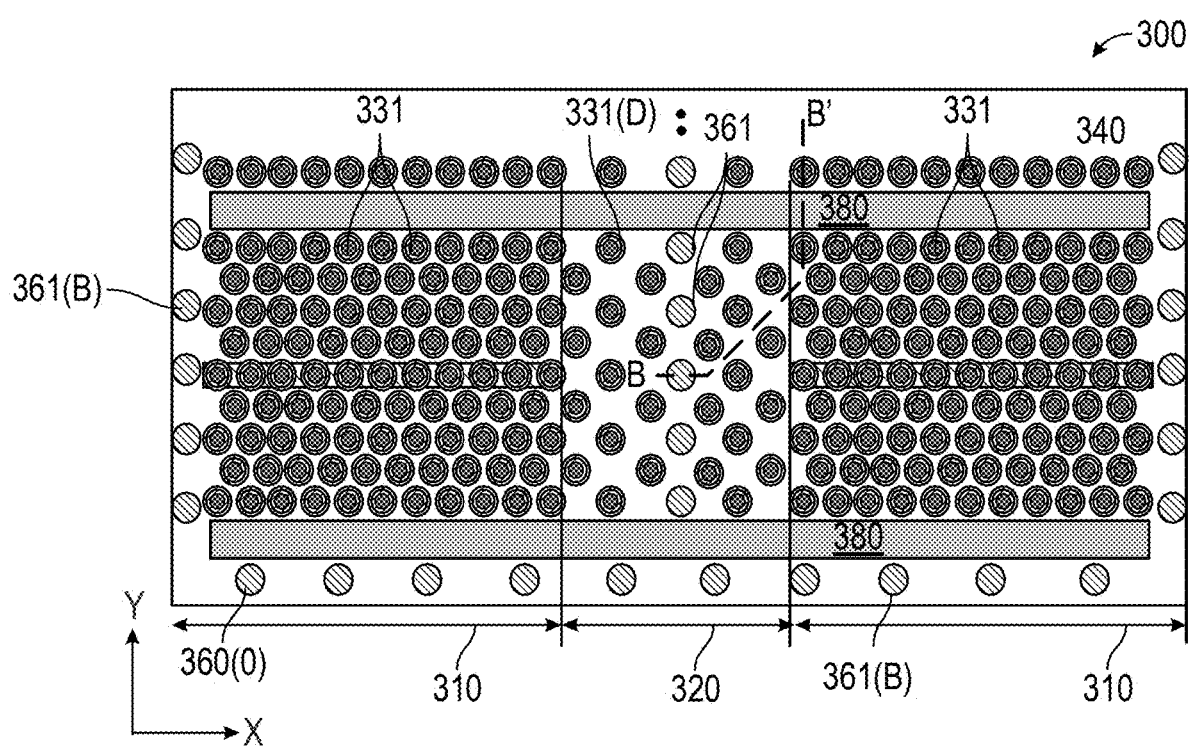
FIG. 3 shows a top view for a semiconductor device according to some embodiments of the disclosure.

FIG. 3 shows a top view 300 for a semiconductor device, such as the semiconductor device 100, according to some embodiments of the disclosure. The top view 300 includes patterns that correspond to top view of some components of the semiconductor device in the X-Y plane. In an example, FIG. 1 is a cross-sectional view of the semiconductor device along B-B' line shown in FIG. 3.

In the FIG. 3 example, the top view 300 includes patterns 380 for gate line cut structures, such as the gate line cut structure 180 in FIG. 1. The patterns 380 have narrow rectangular shapes and are disposed parallel to the X direction. The top view 300 can include two core regions 310 (also referred to as array regions in some examples) and a staircase region 320 (also referred to as connection region in some examples) that is disposed between the core regions 310.

The top view 300 includes patterns 331 in the core regions 310 for channel structures, such as the channel structures 131 in FIG. 1. The top view 300 also includes patterns 331(D) in the staircase region 320 for dummy channel structures.

According to some aspects of the disclosure, the common source layer 340 extensively covers the core regions 310 and the staircase region 320 and includes a high conductive layer, thus contacts to the common source layer 340 can be disposed with flexibility. In an example, contacts can be disposed in the staircase region 320 as shown by 361. In another example, contacts can be disposed at a border of the block, such as shown by 361(B) of the top view 300.

Figure 4:
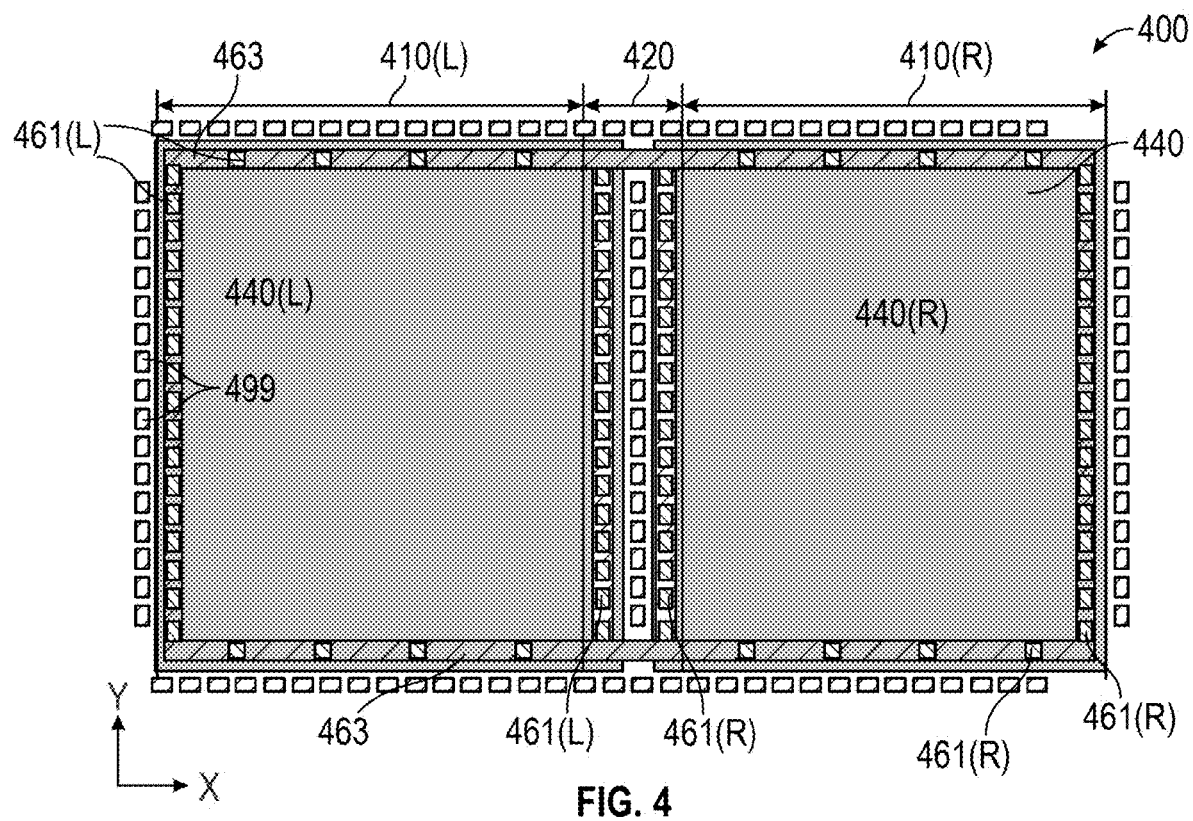
FIG. 4 shows a top view for a semiconductor device according to some embodiments of the disclosure.

FIG. 4 shows a top view 400 for a semiconductor device, such as the semiconductor device 100, according to some embodiments of the disclosure. In some examples, the top view 400 is top view of a die, and includes patterns that correspond to top views of some components, such as the common source layer 140 (ACS), the contact structures 161, via structures 162 to the contact structures, metal wires 163 for interconnecting the via structures 163 in the X-Y plane.

In the FIG. 4 example, the top view 400 shows two rectangular regions 440 (L and R) for the common source layer, such as the common source layer 140. Further, the top view shows two core regions 410 respectively in the two rectangular regions 440 (L and R). A staircase region 420 is disposed between the two core regions 410 (L and R). The rectangular regions 440 (L and R) expend and cover a large portion of the die, such as the core regions 410 (L and R) and the staircase region 420 and the like, and due to a use of a high conducive layer in the common source layer 140, thus the common source layer can provide relatively high conductivity for current distribution. It is noted that, the high conductive layer can include holes (not shown) corresponding to bottoms of channel structures (and/or dummy channel structures).

The top view 400 also includes patterns 461 (L and R) corresponding to contact structures, such as the contact structure 161 in FIG. 1 and the like, that are in conductive connection with the array common source, such as the common source layer 140. It is noted that while rectangular shape of the patterns 461 (L and R) is used to illustrate the contact structures, the contact structures can have other suitable shape, such as circular shape, oval shape, and the like. It is noted that, in some embodiments, the semiconductor device also includes via patterns that may have the similar but smaller top view patterns as the patterns 461. The via patterns correspond to via structures, such as the via structure 162 in FIG. 1. The via structures can be used to conductively connect the contact structures 161 with metal wires.

In the FIG. 4 example, the patterns 461 (L and R) are disposed in the staircase region 420 and around the borders of the rectangular regions 440 (L and R). For example, patterns 461(L) are disposed around the borders of the left rectangular region 440(L), and patterns 461(R) are disposed around the borders of the right rectangular region 440(R). Further, the top view 400 includes pattern 463 that corresponds to metal wires, such as metal wire 163 and the like, that are used to connect the contact structures 161.

In an example that the two core regions belong to the same block (e.g., erase block with memory cells to be erased at the same time), the metal wires 163 as shown by patterns 463 connect the contact structures 161 as shown by patterns 461 (L and R), for example, via the via structures. It is note that, when the two core regions belong to different blocks, the metal wires 163 as shown by patterns 463 can be suitably configured to separately connect the contact structures 461 (L) together, and then the contact structures 461(R) together.

Further, in FIG. 4 example, the top view 400 also shows patterns 499 corresponding to contact pads for the semiconductor device. In some embodiments, the semiconductor device includes an array die and a complementary metal-oxide-semiconductor (CMOS) die that are bonded together. The array die includes vertical memory cell strings, and the CMOS die includes peripheral circuitry for the vertical memory cell strings. In some embodiments, the array die provides the contact pads for the bonded dies. The contact pads can be used to connect the semiconductor device (array die and the CMOS die) to other circuitry.

It is noted that the patterns 499 are for illustrations, the number of the contact pads, the sizes of the contact pads, the distances between the contact pads and the like can be adjusted for example, based on design requirements, supply voltage requirements, contact resistance requirements for the contact pads.

Figure 5:
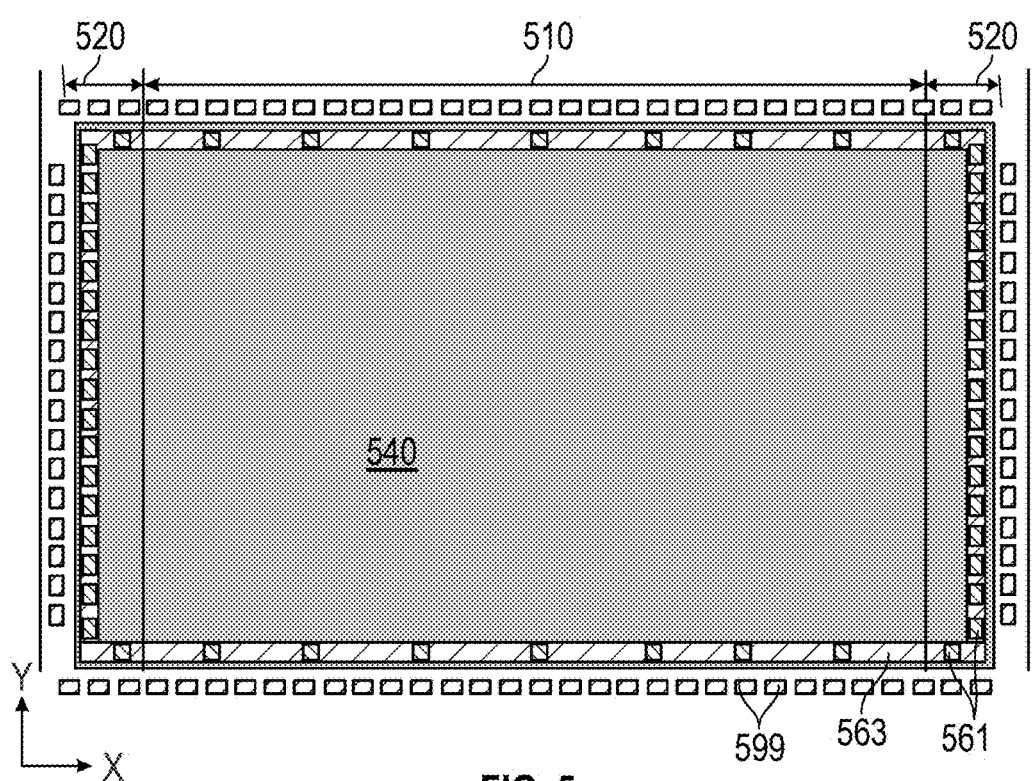
FIG. 5 shows a top view for a semiconductor device according to some embodiments of the disclosure.

FIG. 5 shows a top view 500 for a semiconductor device, such as the semiconductor device 100, according to some embodiments of the disclosure. In some examples, the top view 500 is top view of a die, and includes patterns that correspond to top views of some components, such as the common source layer 140 (ACS), the contact structures 161, via structures to the contact structures, metal wires for interconnecting the via structures in the X-Y plane.

In the FIG. 5 example, the top view 500 shows a rectangular region 540 corresponding to the array common source, such as the common source layer 140. Further, the top view 500 shows a core region 510 and two staircase regions 520 respectively disposed at two sides of the core region 510. The pattern 540 covers a large portion of the die, such as the core region 510 and the staircase regions 520 and the like. Due to the use of a high conductive layer in the common source layer 140, the common source layer 140 can provide relatively high conductivity for current distribution. It is noted that the high conductive layer can include holes (not shown) corresponding to bottoms of channel structures (and/or dummy channel structures).

The top view 500 also includes patterns 561 corresponding to contact structures, such as the contact structure 161 in FIG. 1 and the like, that are in conductive connection with the common source layer 140. It is noted that while rectangular shape of the patterns 561 is used to illustrate the contact structures, the contact structures can have other suitable shape, such as circular shape, oval shape, and the like. It is noted that, in some embodiments, the semiconductor device also includes via patterns that may have the similar but smaller top view patterns as the patterns 561. The via patterns correspond to via structures, such as the via structure 162 in FIG. 1. The via structures can be used to conductively connect the contact structures 161 with metal wires.

In the FIG. 5 example, the patterns 561 are disposed in the staircase region 520 and around the border of the pattern 540. Further, the top view 500 includes pattern 563 that corresponds to metal wires, such as metal wire 163 and the like, that are used to connect the contact structures 161.

Further, in FIG. 5 example, the top view 500 also shows patterns 599 corresponding to contact pads for the semiconductor device. In some embodiments, the semiconductor device includes an array die and a complementary metal-oxide-semiconductor (CMOS) die that are bonded together. The array die includes vertical memory cell strings, and the CMOS die includes peripheral circuitry for the vertical memory cell strings. In some embodiments, the array die provides the contact pads for the bonded dies. The contact pads can be used to connect the semiconductor device (array die and the CMOS die) to other circuitry.

It is noted that in the examples shown in FIG. 2-FIG. 5, the contact structures to the common source layer can be connected using metal wires that are routed way from the array region, thus the array region can be efficiently used for vertical memory cell strings of data storage.

Figure 6:
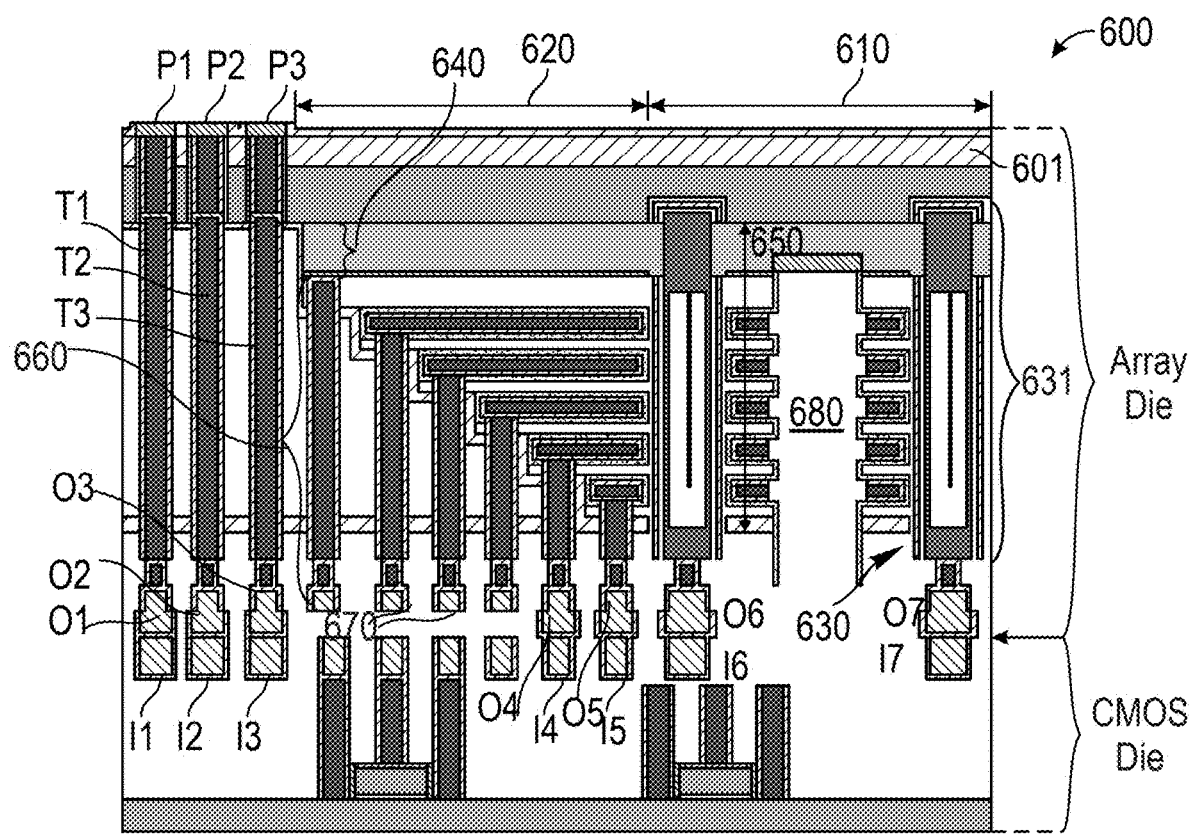
FIG. 6 shows a cross-sectional view of a semiconductor device according to some embodiments of the disclosure.

FIG. 6 shows a cross-sectional view of a semiconductor device 600 having an array die and a CMOS die bonded together according to some embodiments of the disclosure.

The array die includes components that are configured similarly as corresponding components of the semiconductor device 100 shown in FIG. 1. For example, a substrate 601 is similarly configured as the substrate 101; a core region 610 that is similarly configured as the core region 110; a staircase region 620 is similarly configured as the staircase region 120; vertical memory cell strings 630 are similarly configured as the vertical memory cell strings 130; a stack of layers 650 is similarly configured as the stack of layers 150; channel structures 631 are similarly configured as the channel structures 131; gate line cut structures 680 are similarly configured as the gate line cut structures 180; a common source layer 640 is similarly configured as the common source layer 140; ACS contact structures 660 are similarly configured as the ACS contact structures 160; word line connection structures 670 are similarly configured as the word line connection structures 170. The description of these components has been provided above and will be omitted here for clarity purposes.

In the FIG. 6 example, the array die and the CMOS die are disposed face-to-face (circuitry side is face, and the substrate side is back) and bonded together. Generally, the periphery circuitry on the CMOS die interfaces the semiconductor device 600 with external circuitry. For example, the periphery circuitry receives instructions from the external circuitry, provides control signals on the array die, receives data from the array die, and outputs data to the external circuitry.

In the FIG. 6 example, the CMOS die and the array die respectively include bonding structures that can be aligned with each other. For example the CMOS die includes bonding structures I1-I7 and the array die includes corresponding bonding structures O1-O7. The array die and the CMOS die can be suitably aligned, thus the bonding structures I1-I7 are respectively aligned with the bonding structures O1-O7. When the array die and the CMOS die are bonded together, the bonding structures I1-I7 are respectively bonded and electrically coupled with the bonding structures O1-O7.

Further, in the FIG. 6 example, pad-out structures P1-P3 for the semiconductor device 600 are formed on the back side of the array die and the pad-out structures P1-P3 are electrically connected to the bonding structures O1-O3, for example by punch through via structures T1-T3 as shown in FIG. 6.

Figure 7:
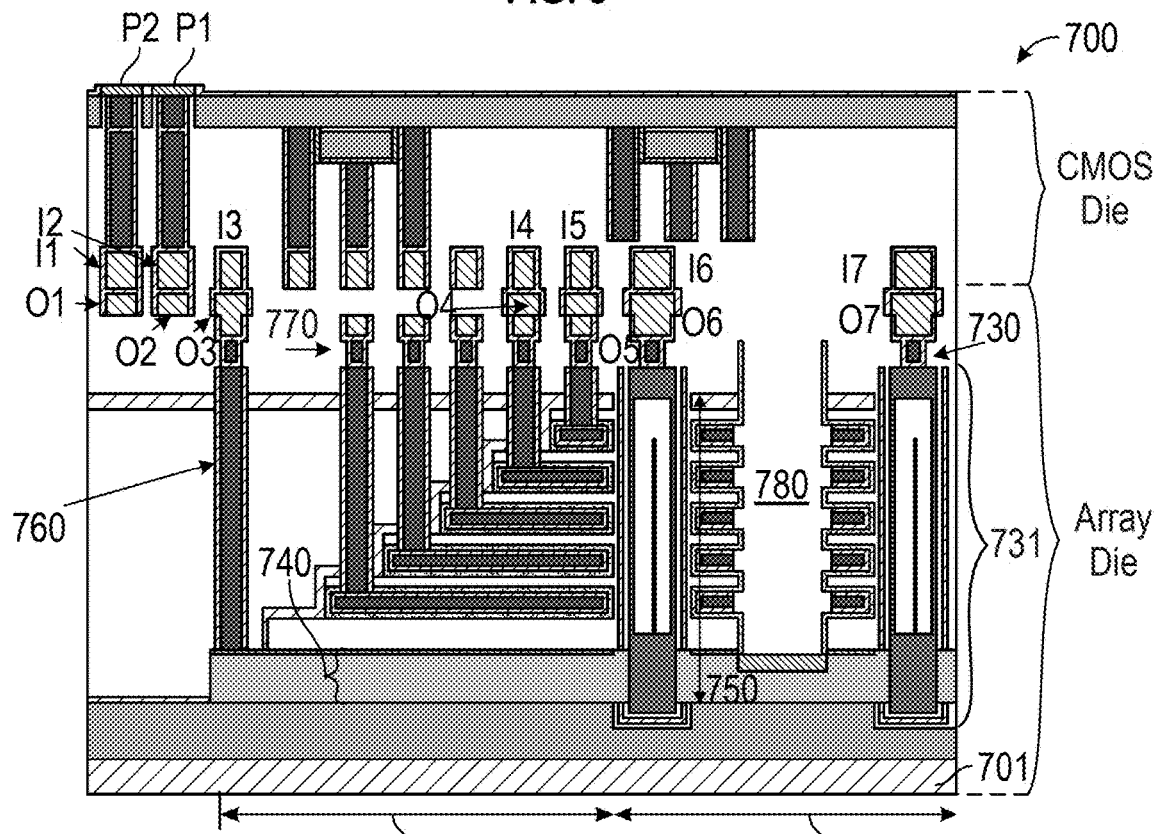
FIG. 7 shows a cross-sectional view of a semiconductor device according to some embodiments of the disclosure.

FIG. 7 shows a cross-sectional view of a semiconductor device 700 having an array die and a CMOS die bonded together according to some embodiments of the disclosure.

The array die includes components that are configured similarly as corresponding components of the semiconductor device 100 shown in FIG. 1. For example, a substrate 701 is similarly configured as the substrate 101; a core region 710 that is similarly configured as the core region 110; a staircase region 720 is similarly configured as the staircase region 120; vertical memory cell strings 730 are similarly configured as the vertical memory cell strings 130; a stack of layers 750 is similarly configured as the stack of layers 150; channel structures 731 are similarly configured as the channel structures 131; gate line cut structures 780 are similarly configured as the gate line cut structures 180; a common source layer 740 is similarly configured as the common source layer 140; ACS contact structures 760 are similarly configured as the ACS contact structures 160; word line connection structures 770 are similarly configured as the word line connection structures 170. The description of these components has been provided above and will be omitted here for clarity purposes.

In the FIG. 7 example, the array die and the CMOS die are disposed face-to-face (circuitry side is face, and the substrate side is back) and bonded together. Generally, the periphery circuitry on the CMOS die interfaces the semiconductor device 600 with external circuitry. For example, the periphery circuitry receives instructions from the external circuitry, provides control signals on the array die, receives data from the array die, and outputs data to the external circuitry.

In the FIG. 7 example, the CMOS die and the array die respectively include bonding structures that can be aligned with each other. For example the CMOS die includes bonding structures I1-I7 and the array die includes corresponding bonding structures O1-O7. The array die and the CMOS die can be suitably aligned, thus the bonding structures I1-I7 are respectively aligned with the bonding structures O1-O7. When the array die and the CMOS die are bonded together, the bonding structures I1-I7 are respectively bonded and electrically coupled with the bonding structures O1-O7.

Further, in the FIG. 7 example, pad-out structures P1-P2 for the semiconductor device 700 are formed on the back side of the CMOS die. In the FIG. 7 example, the input/output signals do not need to route through the array die, thus the signal paths for the input/output signals of the semiconductor device 700 can be shorter than the signals paths in FIG. 6.

Figure 8:
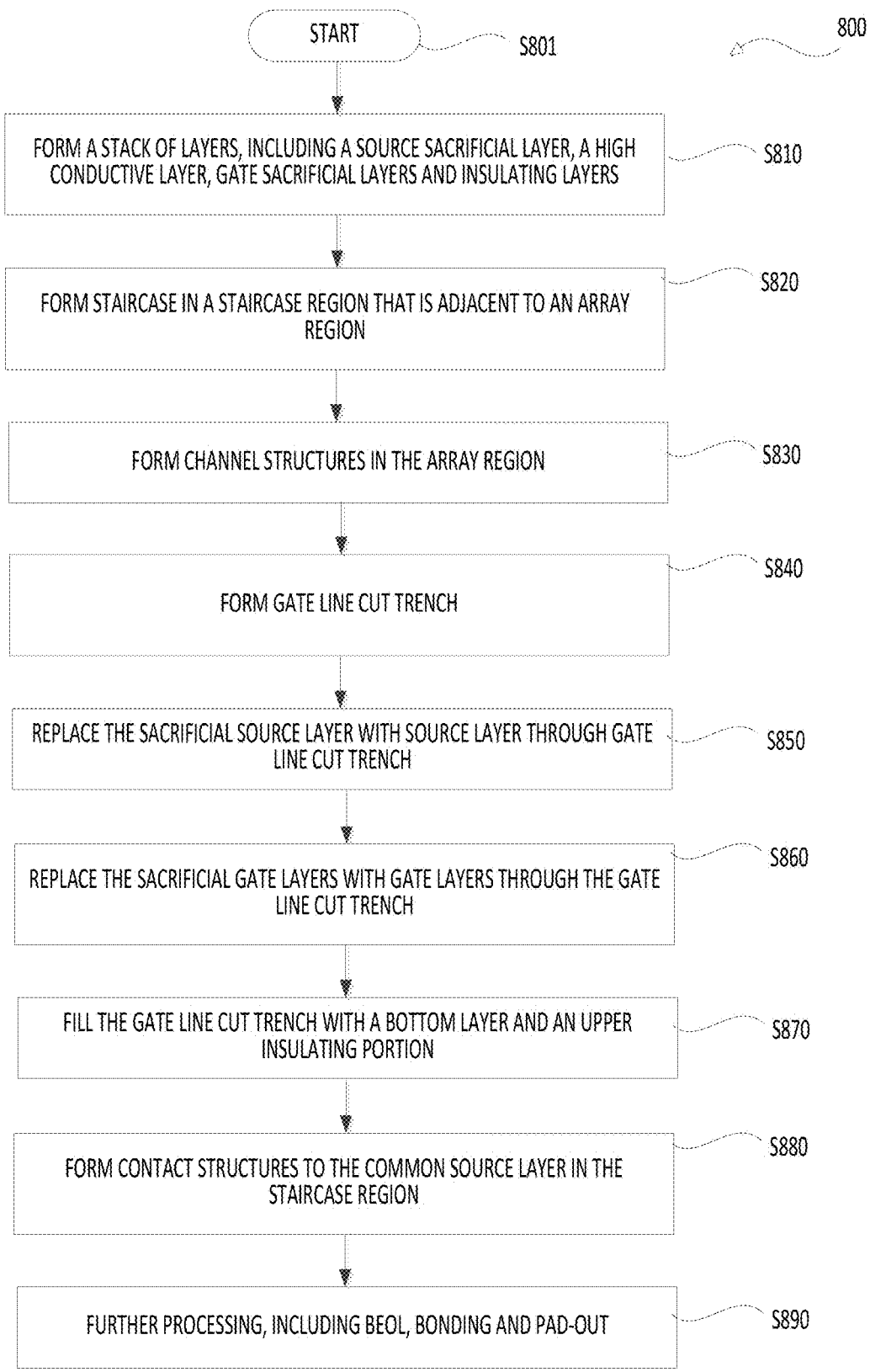
FIG. 8 shows a flow chart outlining a process example according to some embodiments of the disclosure.
Figure 9A:
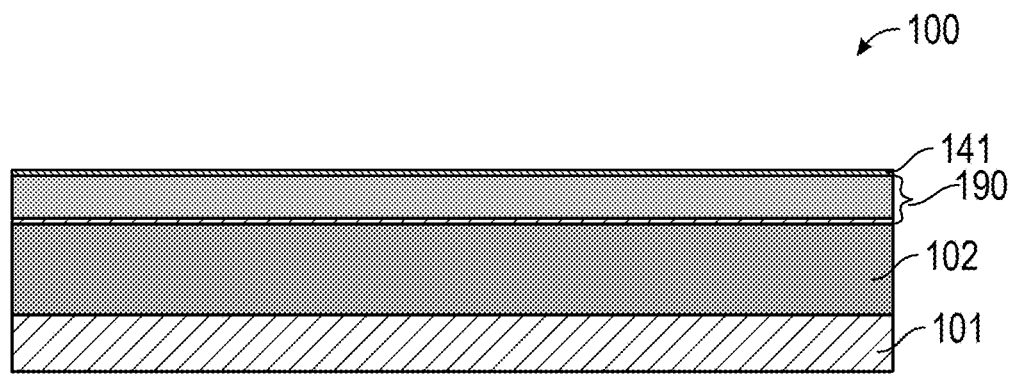
FIGS. 9A-9R show cross-sectional views of a semiconductor device according to some embodiments of the disclosure.

FIG. 8 shows a flow chat outlining a process example for fabricating a semiconductor device, such as the semiconductor device 100 and according to some embodiments of the disclosure. FIGS. 9A-9R show cross-sectional views of a semiconductor device, such as the semiconductor device 100, the semiconductor device 600, during fabrication. It is noted that the cross-sectional views are labeled in the context of the semiconductor device 100 and the semiconductor device 600 as an example, the cross-sectional views can be suitably labeled in the context of other suitable semiconductor device, such as the semiconductor device 700 and the like.

At S810, a stack of initial layers is formed on a substrate. The stack of initial layers includes a source sacrificial layer, a high conductive layer, insulating layers and gate sacrificial layers.

FIG. 9A shows a cross-sectional view of the semiconductor device 100 after the source sacrificial layer, and the high conductive layer are formed on the substrate 101.

In the FIG. 9A example, a polysilicon well 102 is formed on the substrate 101 and then a source sacrificial layer 190 and a high conductive layer 141 are sequentially deposited. In some examples, the source sacrificial layer 190 is a stack of suitable sacrificial layers. In an example, the source sacrificial layer 190 includes, for example, a silicon oxide layer, a silicon nitride layer, a polysilicon layer, a silicon nitride layer and a silicon oxide layer from bottom up. The polysilicon layer is sandwiched between two silicon nitride layers and then two silicon oxide layers.

In some examples, the high conductive layer 141 is formed by a titanium layer that is later brought in contact with polysilicon layer (e.g., source layer) to form titanium silicide under a relatively high temperature (e.g., above 500° C.).

Referring back to FIG. 8, at S820, a staircase is formed in a staircase region that is adjacent to an array region.

At S830, channel structures are formed in the array region.

Figure 9B:
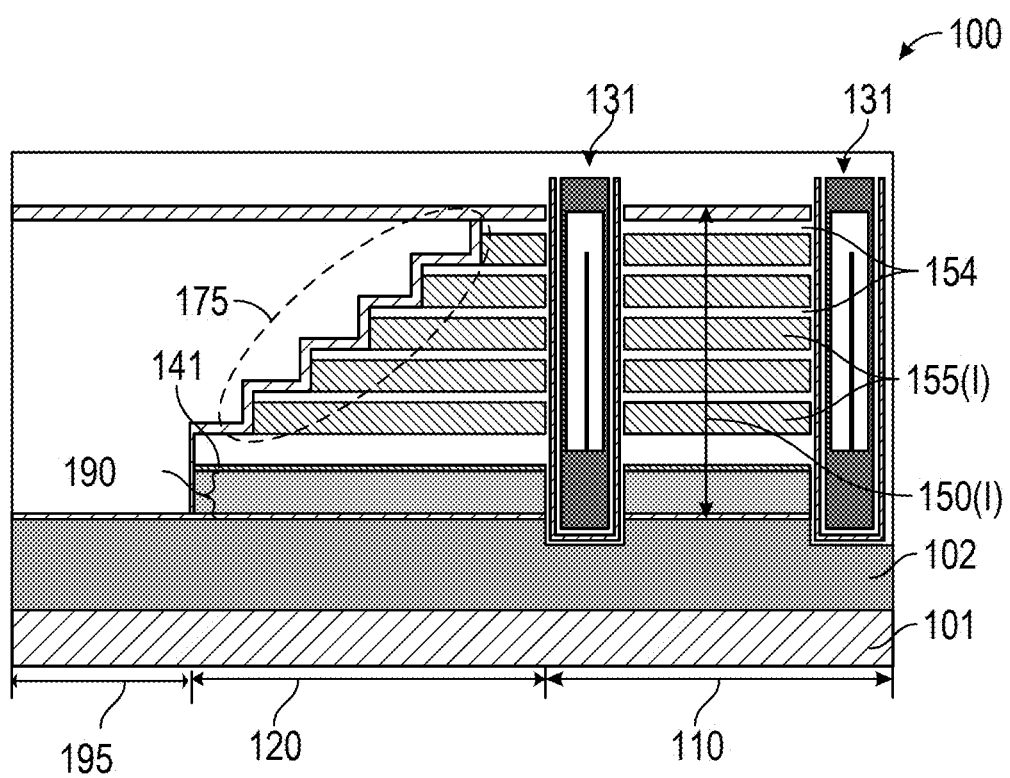

FIG. 9B shows a cross-sectional view of the semiconductor device 100 after the channel structures are formed.

In the FIG. 9B example, an initial stack of layer 150(I) is deposited on the high conductive layer 141. The initial stack of layers 150(I) includes sacrificial gate layers 155(I) and insulating layers 154 that are stacked alternatingly. Several regions are defined on the substrate, such as the core region 110, the stair region 120 and a border region 195.

In the FIG. 9B example, steps 175 are formed in the staircase region. Any suitable process can be used to form the steps. In some examples, an etch-trim process is used. In an example, a mask layer is formed that covers the array region 110 and a portion of the staircase region 120 adjacent to the array region 110. The mask layer can include a photoresist or carbon-based polymer material, and can be formed using a patterning process such as lithography. In some embodiments, the mask layer can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using O2 or CF4 chemistry.

In some embodiments, the steps 175 can be formed by applying a repetitive etch-trim process using the mask layer. The etch-trim process includes an etching process and a trimming process. During the etching process, a portion of the initial stack with exposed surface can be removed. In an example, the etch depth equals to a layer pair that is the thickness of a sacrificial gate layer and an insulating layer. In an example, the etching process for the insulating layer can have a high selectivity over the sacrificial layer, and/or vice versa.

In some embodiments, the etching of the stack is performed by an anisotropic etching such as a reactive ion etch (RIE) or other dry etch processes. In some embodiments, the insulating layer is silicon oxide. In this example, the etching of silicon oxide can include RIE using fluorine based gases such as carbon-fluorine (CF4), hexafluoroethane (C2F6), CHF3, or C3F6 and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the sacrificial layer is silicon nitride. In this example, the etching of silicon nitride can include RIE using O2, N2, CF4, NF3, Cl2, HBr, BCl3, and/or combinations thereof. The methods and etchants to remove a single layer stack should not be limited by the embodiments of the present disclosure.

The trimming process includes applying a suitable etching process (e.g., an isotropic dry etch or a wet etch) on the mask layer such that the mask layer can be pulled back (e.g., shrink inwardly) laterally in the x-y plane from edges. In some embodiments, the trimming process can include dry etching, such as RIE using O2, Ar, N2, etc.

After trimming the mask layer, one portion of the topmost level of the initial stack is exposed and the other portion of the topmost level of the initial stack remains covered by the mask layer. The next cycle of etch-trim process resumes with the etching process.

Further, channel structures 131 are formed in the array region 110. In some embodiments, after the steps 175 are formed in the staircase region 120, suitable planarization process is performed to obtain a relatively flat surface. Then, photo lithography technology is used to define patterns of channel holes and dummy channel holes (not shown) in photoresist and/or hard mask layers, and etch technology is used to transfer the patterns into the stack of initial layers 150(I), the high conductive layer 141, the source sacrificial layer 190 and into the polysilicon well 102. Thus, channel holes can be formed in the core region 110 and the staircase region 120 (channels holes in the staircase region are not shown).

Then, channel structures 131 are formed in the channel holes. In some embodiments, dummy channel structures can be formed with the channel structures, thus the dummy channel structures are formed of the same materials as the channel structures. In an example, the blocking insulating layer is formed on the sidewall of channel holes and the dummy channel holes. Then, a charge storage layer, a tunneling insulating layer, a semiconductor layer, and an insulating layer are sequentially stacked from the sidewall.

Referring back to FIG. 8, at S840, gate line cut trenches are formed. In some embodiments, the gate line cut trenches are etched to a source sacrificial layer. In some embodiments, the high conductive layer 141 is used as an etch stop layer for the etch process to form the gate line cut trenches.

Figure 9C:
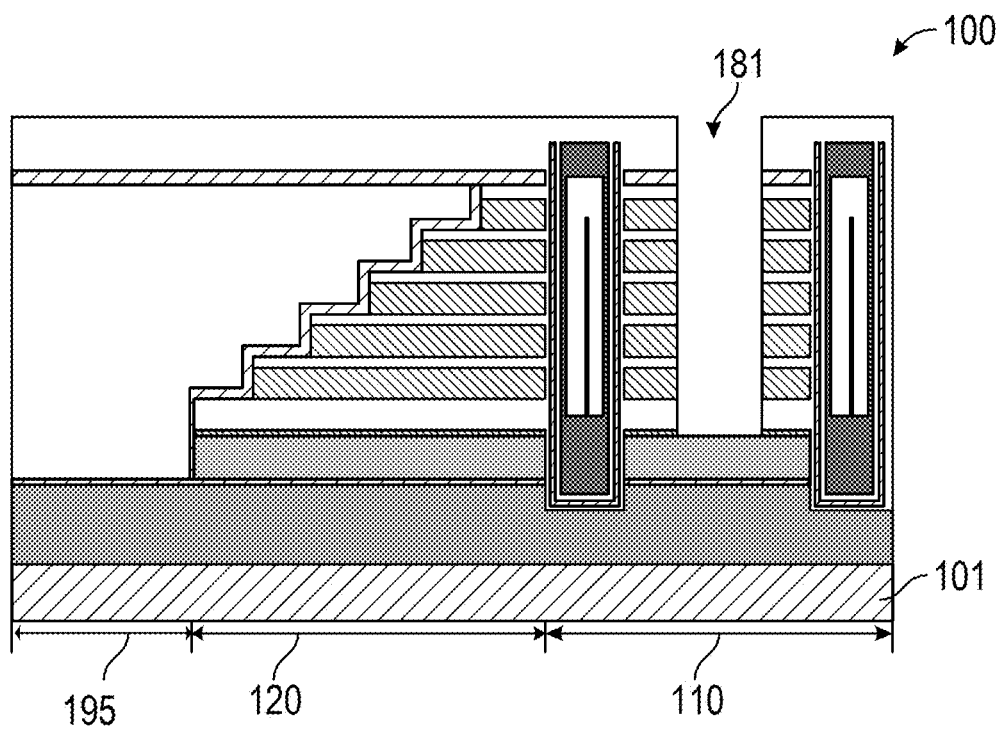

FIG. 9C shows a cross-sectional view of the semiconductor device 100 after a gate line cut trench 181 is formed.

Referring back to FIG. 8, at S850, the source sacrificial layer is replaced with a source layer using through the gate line cut trench.

In an example, a spacer structure is formed on the sidewall of the gate line cut structures that can protect the gate sacrificial layers during the replacement of the source sacrificial layer.

Figure 9D:
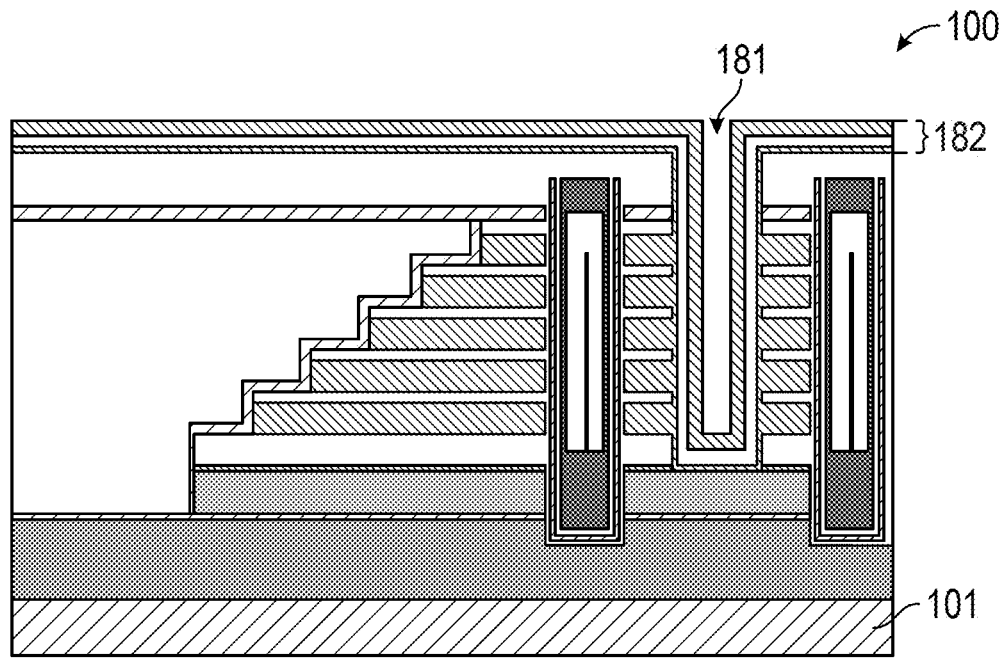

FIG. 9D shows a cross-sectional view of the semiconductor device 100 after spacer layers 182 are deposited on the sidewall of the gate line cut trench 181. In some examples, the spacer layers 182 include a nitride layer, an oxide layer and another nitride layer.

Then, in an example, a spacer etch process is performed to remove excess spacer materials at the bottom of the gate line cut trench 181. The spacer etch process can also remove the spacer material at the upper surface of the semiconductor device 100.

Figure 9E:
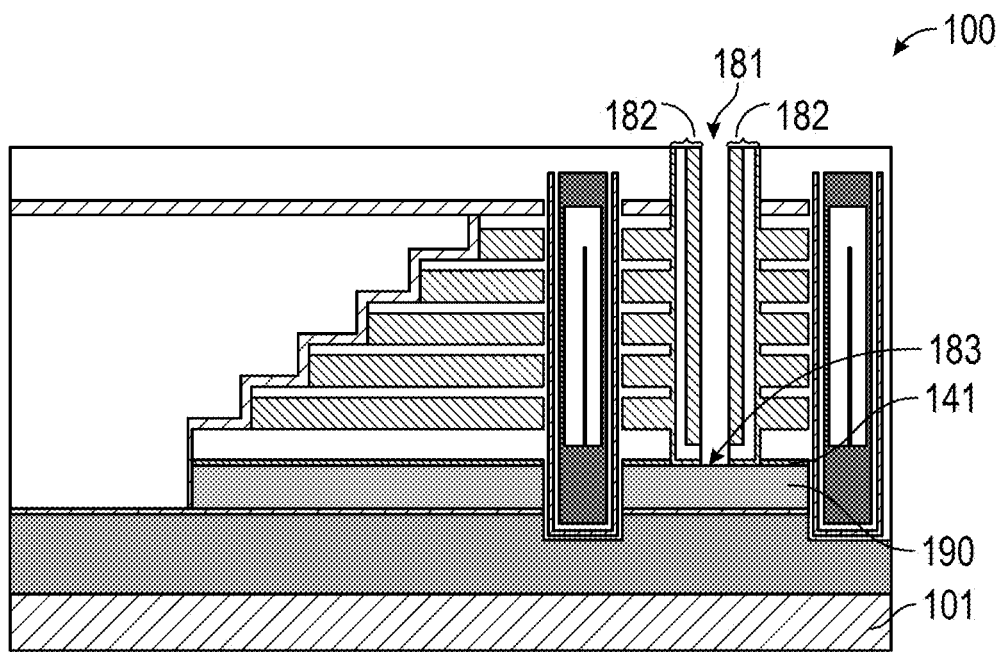

FIG. 9E shows a cross-sectional view of the semiconductor device 100 after the spacer etch process. The spacer materials at the bottom of the gate line cut trench 181 are removed as shown by 183, and the spacer layers 182 remain on the sidewall of the gate line cut trench 181. It is noted that the spacer materials at the upper surface of the semiconductor device 100 are also removed by the spacer etch process. In some example, the spacer etch process is an anisotropic etching process.

Further, the source sacrificial layers are removed through the gate line cut trenches. The removal of the source sacrificial layers forms an opening.

Figure 9F:
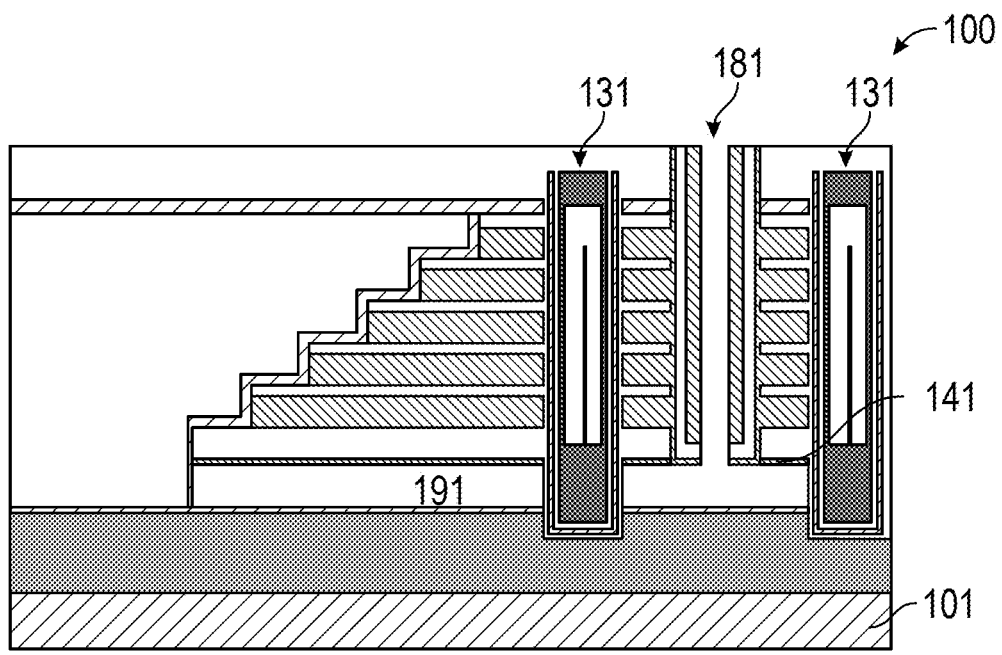

FIG. 9F shows a cross-sectional view of the semiconductor device 100 after the removal of the source sacrificial layers. As shown, an opening 191 is formed in the place of the source sacrificial layers and the bottom portion of the channel structure 131 is exposed to the opening 191.

In some embodiments, the channel structure 131 includes the blocking insulating layer, the charge storage layer, the tunneling insulating layer that have oxide-nitride-oxide (ONO) structure surrounding the semiconductor layer. Then, subsequently, an ONO removal process is performed to expose the bottom portion of the semiconductor layer in the channel structure 131 to the opening 191.

Figure 9G:
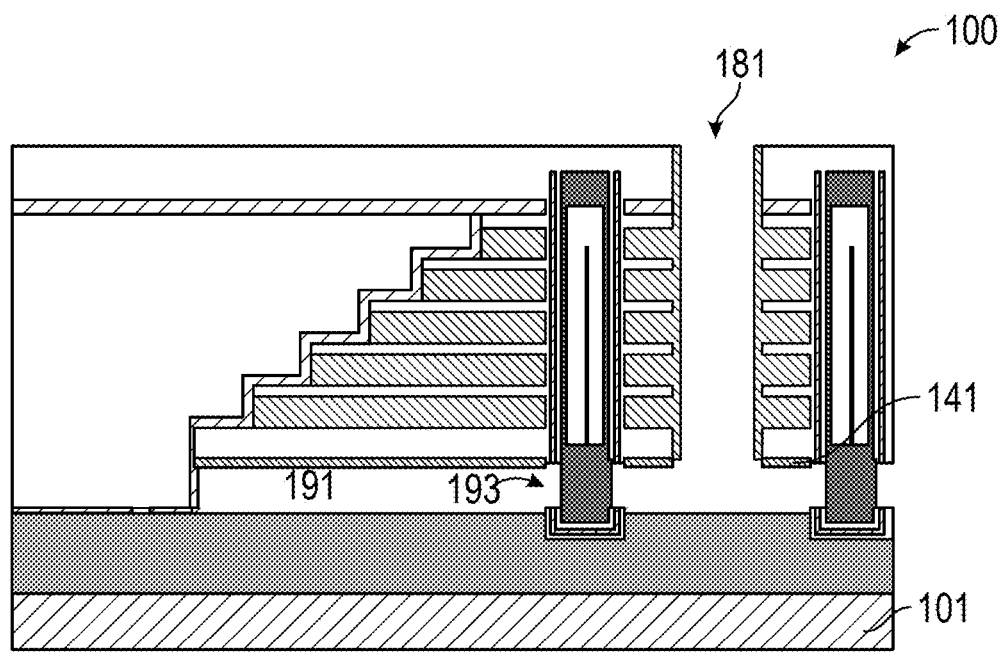

FIG. 9G shows a cross-sectional view of the semiconductor device 100 after the ONO removal process. As shown by 193, the blocking insulating layer, the charge storage layer, the tunneling insulating layer at the bottom the of channel structure 131 have been removed, and thus the bottom portion of the semiconductor layer in the channel structure 131 is exposed to the opening 191. It is noted that a portion of the spacer may be removed during the ONO removal process.

Subsequently, polysilicon is deposited in the opening 191 via the gate line cut trench 181. In some embodiments, a sidewall selective epitaxial growth is performed to grow epitaxial layer and fill the opening 191 with source material 142, such as doped or un-doped silicon, doped or un-doped polysilicon, doped or un-doped amorphous silicon and the like.

Figure 9H:
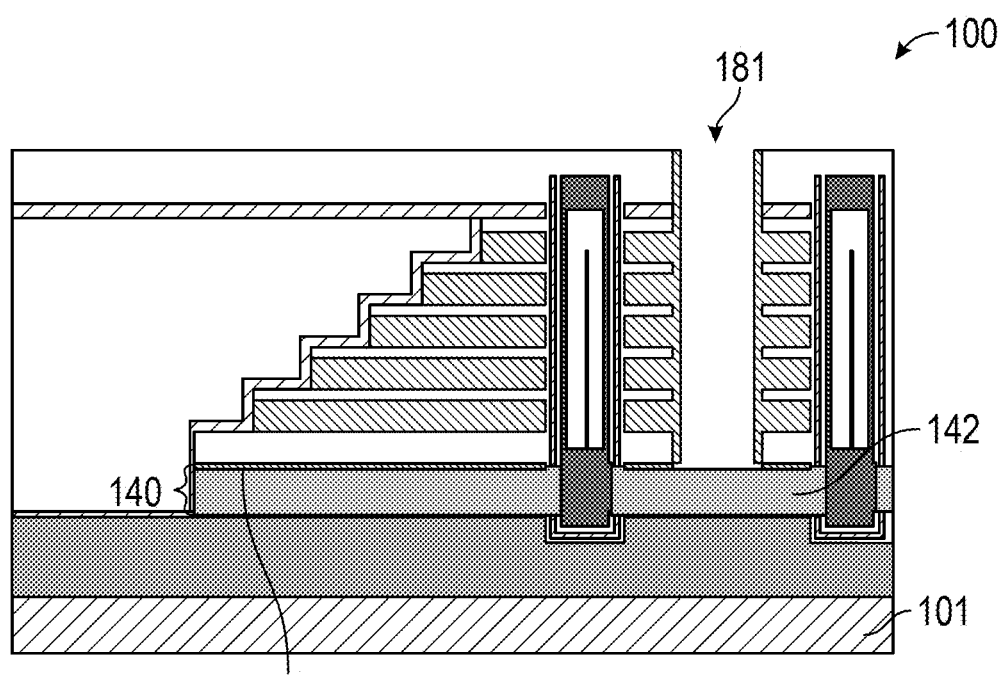

FIG. 9H shows a cross-sectional view of the semiconductor device 100 after the polysilicon deposition in some embodiments. The source material 142 is then in contact with the semiconductor layer (for forming channel of the memory cells and select transistors) at the bottom of the channel structure 131. The source material 142 is in conductive connection (in direct contact) with the high conductive layer 141. In an example, the high conductive layer 141 includes titanium that is in contact with the silicon and can form titanium silicide. The high conductive layer 141 and the source material 142 then form common source layer 140.

Referring back to FIG. 8, at S860, the sacrificial gate layers are replaced with gate layers through the gate line cut trench. In some embodiments, using the gate line cut trench 181, the gate sacrificial layers 155(I) can be replaced by the gate layers 155. In an example, etchants to the gate sacrificial layers are applied via the gate line cut trenches to remove the gate sacrificial layers. In an example, the gate sacrificial layers are made of silicon nitride, and the hot sulfuric acid ($H_2SO_4$) is applied via the gate line cut trenches to remove the gate sacrificial layers.

Figure 9I:
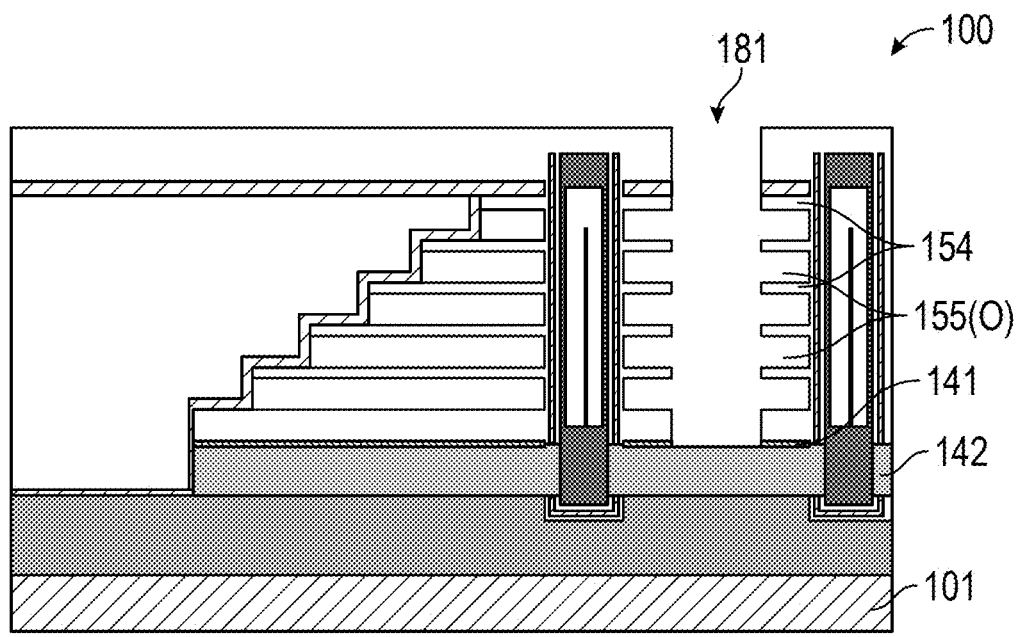

FIG. 9I shows a cross-sectional view of the semiconductor device 100 after the gate sacrificial layers 155(I) are removed. The removal of the gate sacrificial layers 155(I) leave openings 155(O).

Further, via the gate line cut trenches, gate stacks 155 to the transistors in the array region are formed. In an example, a gate stack 155 is formed of a high-k dielectric layer, a glue layer and a metal layer. The high-k dielectric layer can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

Figure 9J:
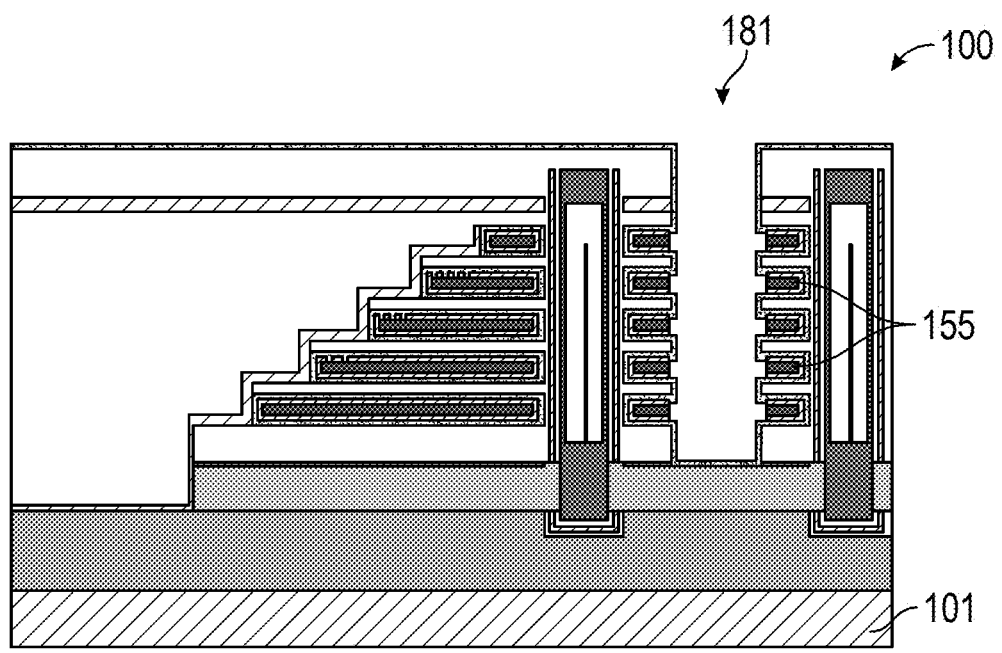

FIG. 9J shows a cross-sectional view of the semiconductor device 100 when the gate stacks 155 are filled into the openings.

It is noted that the deposition process of the gate stack 155 may deposit excess material, such as the high-k dielectric layer, the glue layer (e.g., TiN) and the metal layer (e.g., tungsten) on the upper surface of the semiconductor device 100 and the bottom of the gate line cut trench 181. In the FIG. 9J example, the glue layer (e.g., TiN) and the metal layer (e.g., tungsten) on the upper surface of the semiconductor device 100 and the bottom of the gate line cut trench 181 are removed for example by anisotropic etch process. The high-K dielectric layer on the upper surface of the semiconductor device 100 and the bottom of the gate line cut trench 181 can be further removed, for example, using an anisotropic etch process.

Figure 9K:
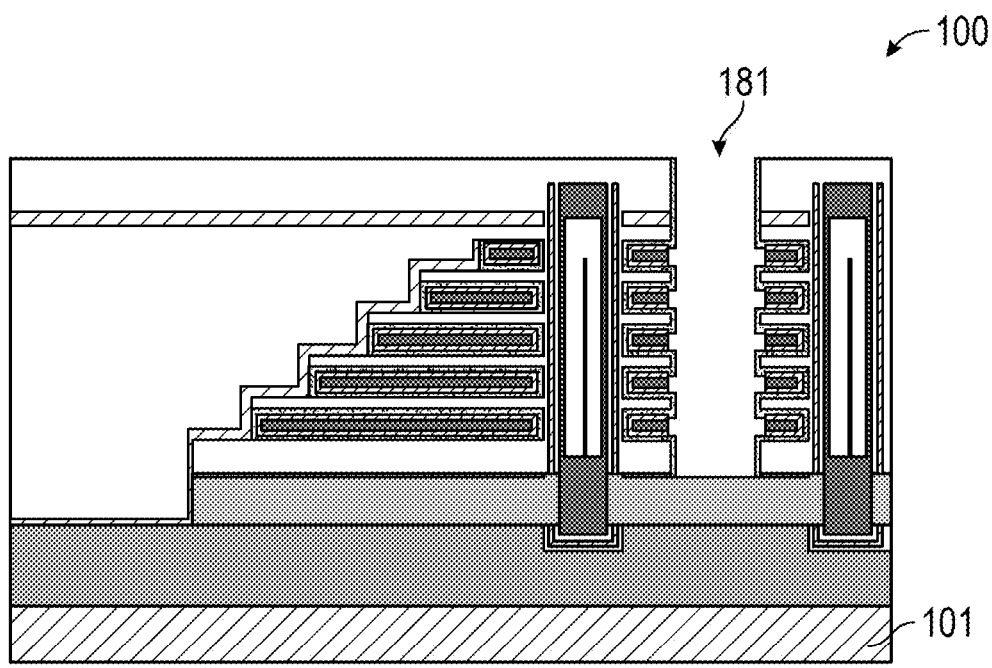

FIG. 9K shows a cross-sectional view of the semiconductor device 100 after the high-K dielectric layer on the upper surface of the semiconductor device 100 and the bottom of the gate line cut trench 181 is removed.

Referring back to FIG. 8, at S870, the gate line cut trench is filled. In some embodiments, the gate line cut trench is filled with a bottom conductive layer and an upper insulating portion to form the gate line cut structure. The bottom conductive layer is in conductive connection with the high conductive layer 141.

In an example, after the high-K dielectric layer on the bottom of the gate line cut trench 181 is removed, the source layer 142 is exposed. Then, a metal layer, such as titanium, can be deposited.

Figure 9L:
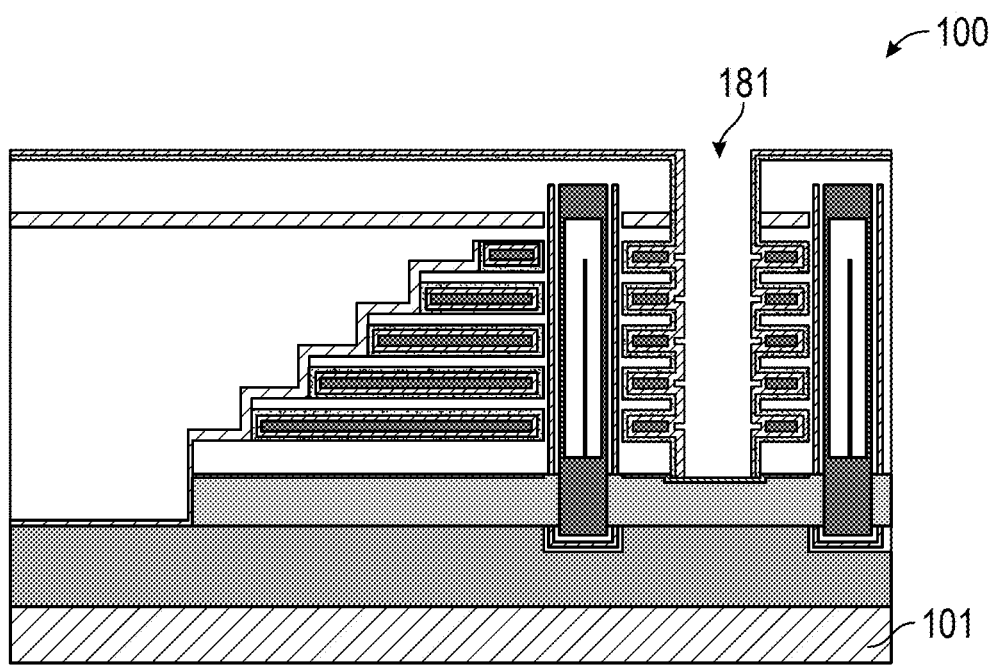

FIG. 9L shows a cross-sectional view of the semiconductor device 100 after the deposition of the metal layer (e.g., titanium). The titanium is deposited on the bottom of the gate line cut trench 181 and the upper surface of the semiconductor device 100. The titanium deposited on the upper surface of the semiconductor device 100 can be selectively removed.

Figure 9M:
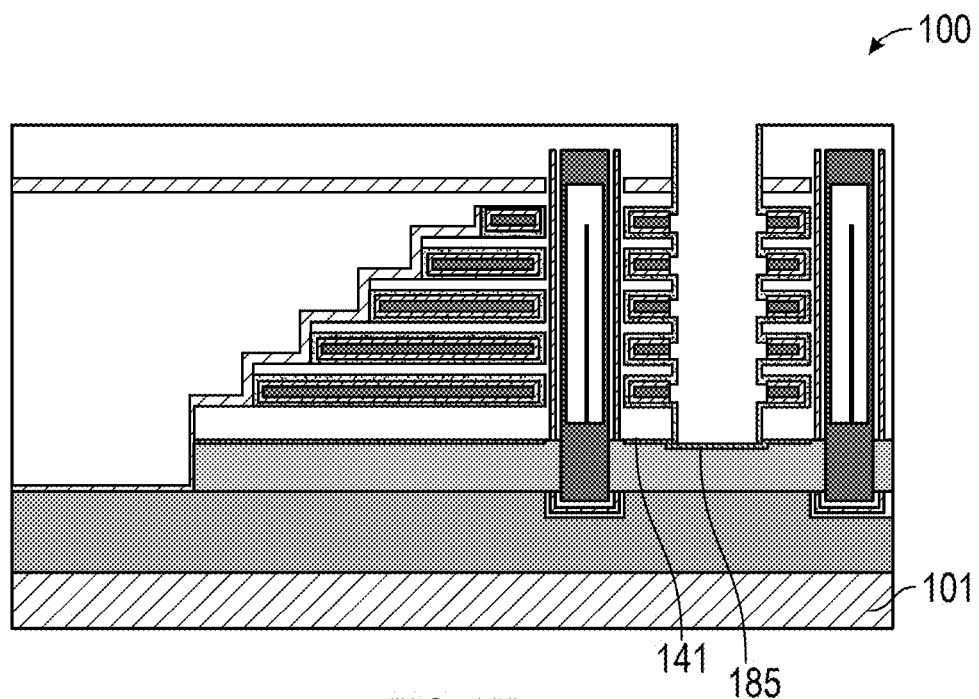

FIG. 9M shows a cross-sectional view of the semiconductor device 100 after the removal of the excess titanium on the upper surface of the semiconductor device 100. In an example, the titanium deposited on the bottom surface of gate line cut trench 181 can react with the polysilicon of the source layer 142 to form titanium silicide 185. The titanium silicide 185 is in conductive connection with the high conductive layer 141 in some examples.

Further, insulating material, such as silicon oxide can be deposited to fill the gate line cut trench 181.

Figure 9N:
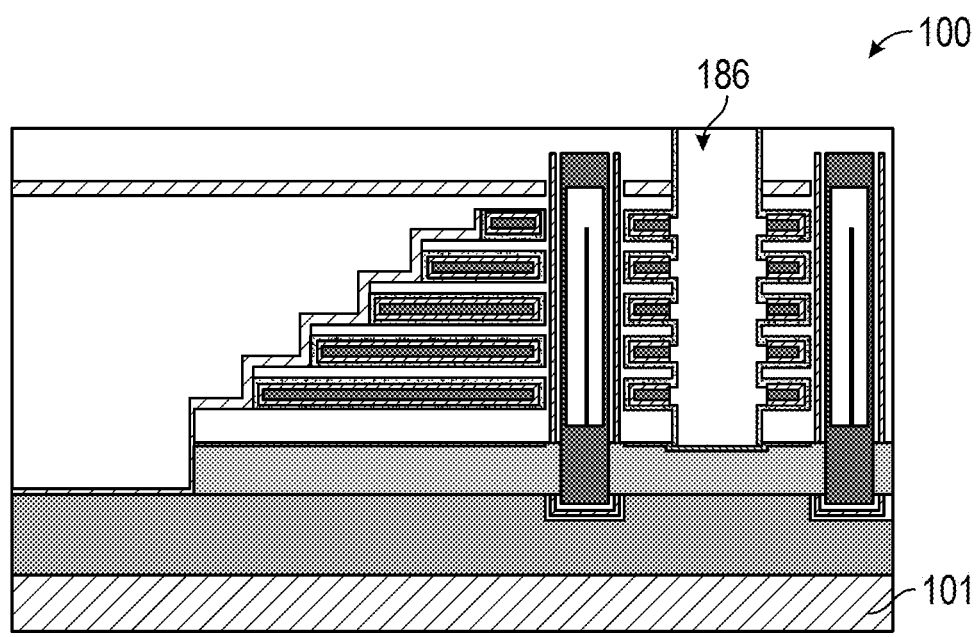

FIG. 9N shows a cross-sectional view of the semiconductor device 100 after the gate line cut trench 181 is filled with insulating material, as shown by 186.

Referring back to FIG. 8, at S880, contact structures to the common source layer are formed in staircase region. In some embodiments, the contact structures to the common source layer are formed with the contact structures to other portions of the vertical memory cell strings, such as the contact structures to the gate layers, and the like. In some examples, a same mask that includes patterns for the contact structures to the common source layer 140, and patterns for other contacts structures, such as the contact structures to the gate layers, and the like. The mask is used to form contact holes for the contact structures. Etch process can be used to form the contact holes. The high conductive layer 141 can be used as an etch stop layer for forming the contact holes to the common source layer 140.

At S890, the fabrication process continues to, for example, back end of line (BEOL) processes. The back end of line processes are used to form various connection structures, such via structures, metal wires, punch through via structure, and the like.

Figure 9O:
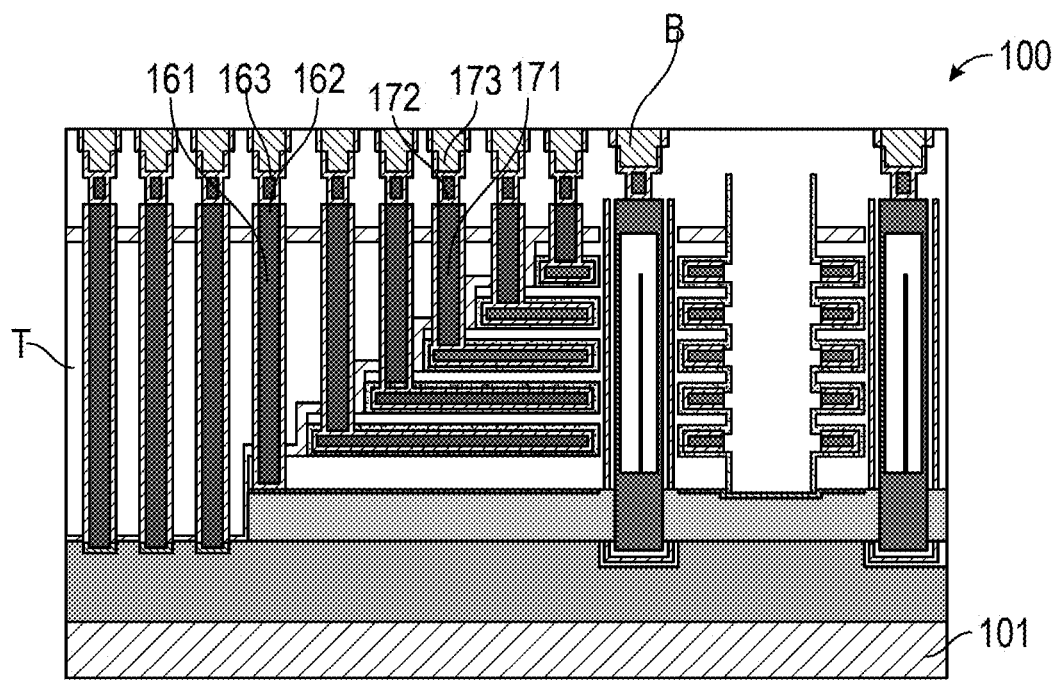

FIG. 9O shows a cross-sectional view of the semiconductor device 100 after the BEOL processes according to some embodiments of the disclosure. Various connection structures are formed on the semiconductor device 100, such as the contact structure 161 to the common source layer 140, the contact structures 171 to the gate layers, the via structures 162 and 172, the wires 163 and 173, bonding structures B, punch through via structures T, and the like. In some examples, a semiconductor die with memory array formed on a substrate of the semiconductor die is referred to as an array die.

In some embodiments, the semiconductor device 100 is the array die that can be coupled with a CMOS die. Additional processes, such as a bonding process, a thinning process, a contact pad process, and the like can be used to electrically couple the array die and the CMOS die.

Figure 9P:
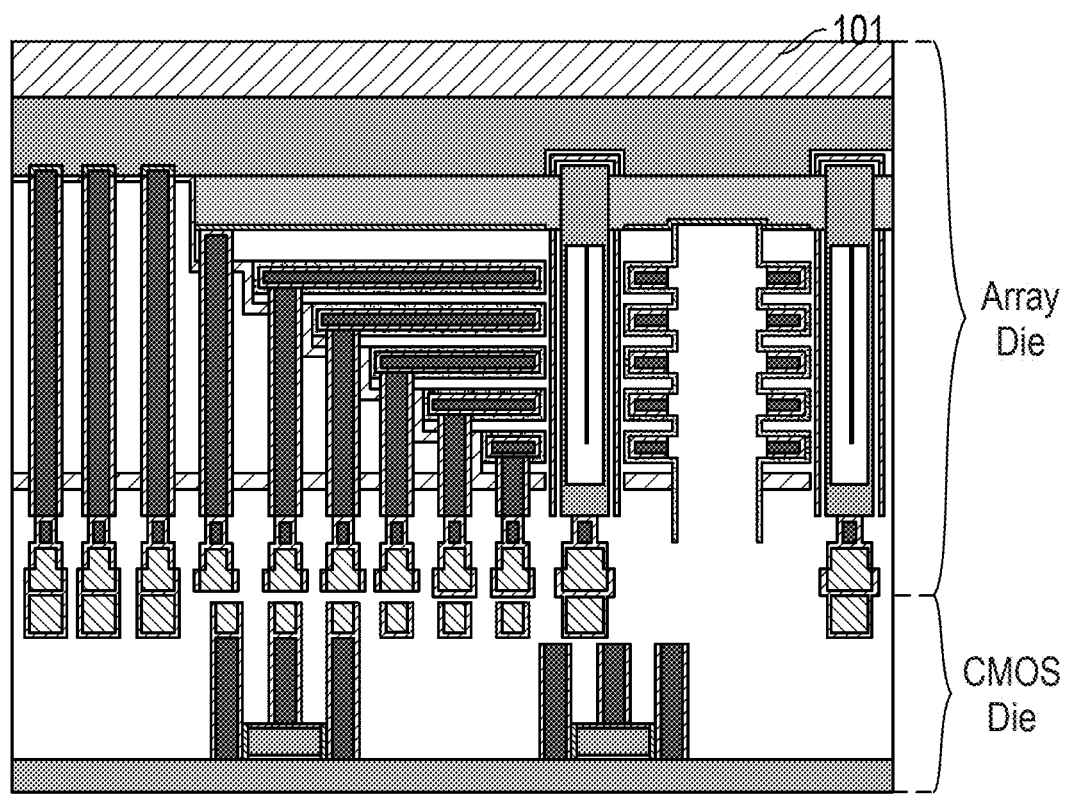

FIG. 9P shows a cross-sectional view of the semiconductor device 600 with the array die (e.g., semiconductor device 100) bonded with a CMOS die. In an example, the array die and the CMOS die are disposed face to face with corresponding bonding structures aligned, then the bonded together.

In some examples, the contact pads are from the back side of the array die.

Figure 9Q:
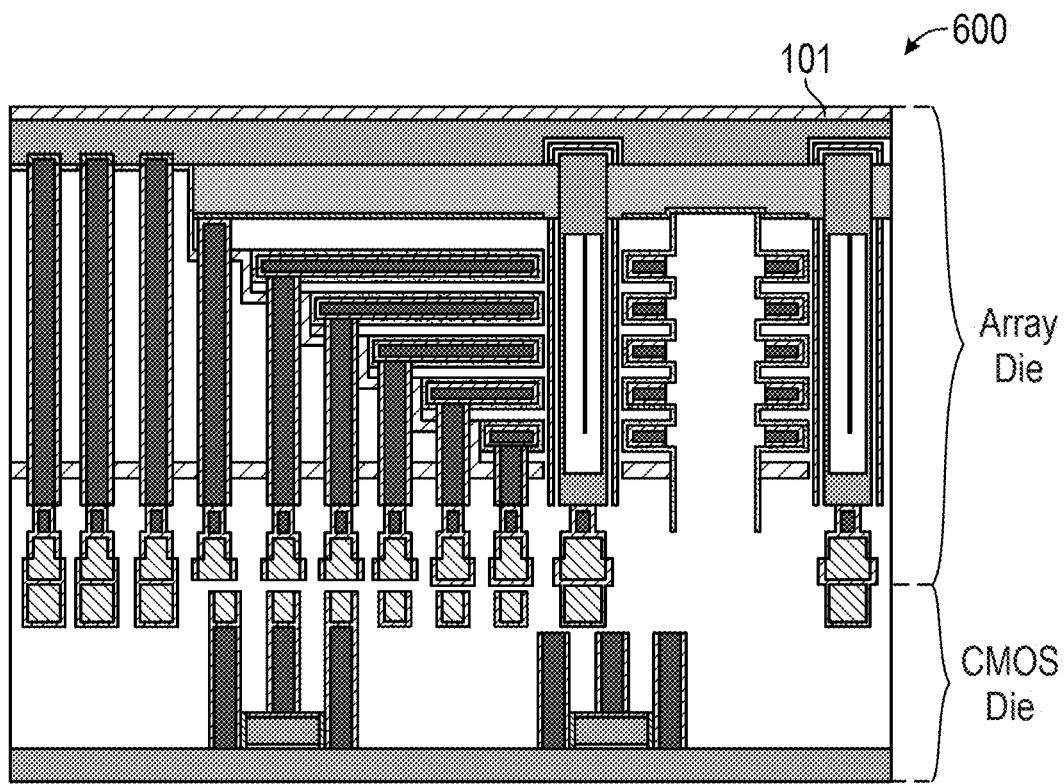
Figure 9R:
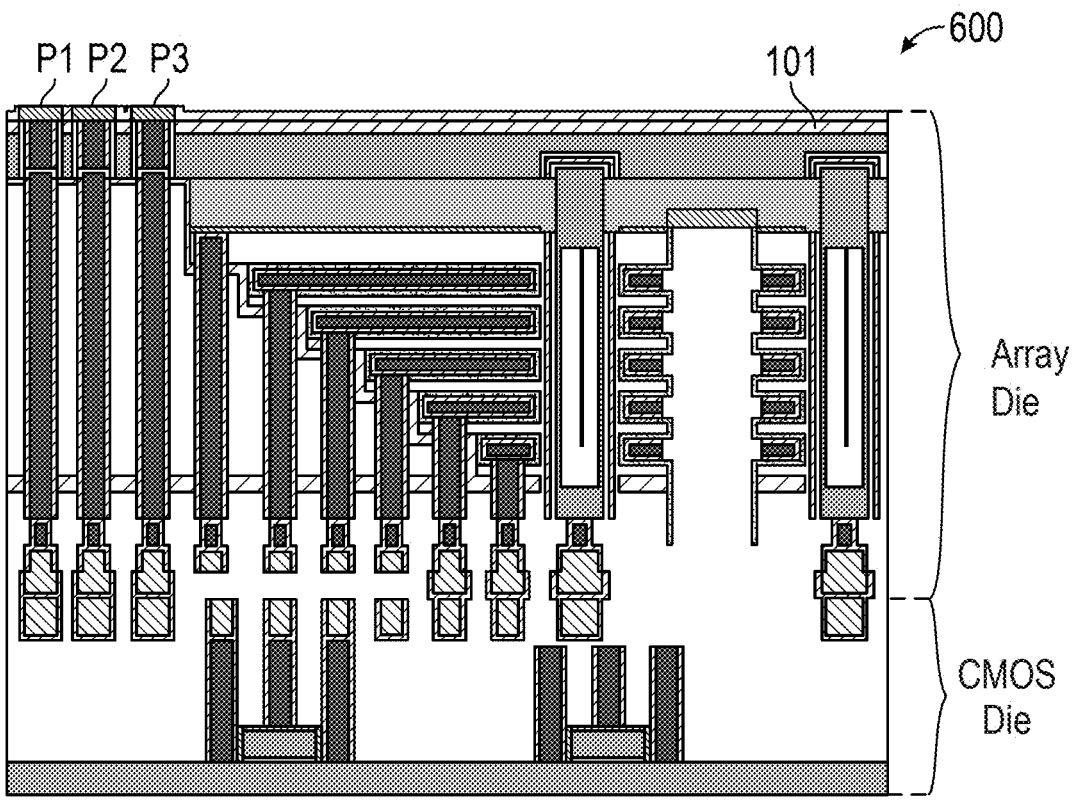

FIG. 9Q shows a cross-sectional view of the semiconductor device 600 according to some embodiments of the disclosure. The back side of the array wafer is thinned for example using chemical mechanical polishing process.

FIG. 9R shows a cross-sectional view of the semiconductor device 100 with contact pads P1-P3 formed on the back side of the array die.

It is noted that FIG. 9O-9R show process examples to form contact pads on the back side of the array die, similar processes can be used to form contact pads on the back side of the CMOS die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
   forming a stack of layers on a substrate, the stack of layers comprising a source sacrificial layer, a conductive layer, and alternating gate sacrificial layers and insulating layers, wherein the conductive layer is stacked on the source sacrificial layer and directly contacts the source sacrificial layer, and the alternating gate sacrificial layers and insulating layers are stacked on the conductive layer and directly contact the conductive layer;
   forming a staircase into the stack of layers in a staircase region that is adjacent to an array region;
   forming channel structures in the array region, a channel structure comprising a channel layer surrounded by one or more insulating layers and extending into the stack of layers;
   replacing the source sacrificial layer with a source layer in conductive connection with the channel layer, the source layer and the conductive layer forming a common source layer;
   replacing the gate sacrificial layers with gate layers; and
   forming a first contact structure in the staircase region, the first contact structure forming a conductive connection with the common source layer.

2. The method of claim 1, wherein forming the stack of layers further comprising:
   depositing a metal layer on the source sacrificial layer, as the conductive layer.

3. The method of claim 2, wherein the metal layer comprises at least one of titanium (Ti), cobalt (Co), nickel (Ni), and platinum (Pt).

4. The method of claim 1, further comprising:
   forming a gate line cut structure with a bottom conductive layer in conductive connection with the common source layer.

5. The method of claim 4, further comprising:
   etching a gate line cut trench into the stack of layers with the conductive layer being an etch stop layer.

6. The method of claim 5, further comprising:
   replacing, through the gate line cut trench, the source sacrificial layer with the source layer;
   forming a metal silicide layer at a bottom of the gate line cut trench; and
   filling the gate line cut trench with insulating material.

7. The method of claim 1, wherein forming the first contact structure in the staircase region further comprises:
   etching a contact hole for forming the first contact structure, with the conductive layer being an etch stop layer.

8. The method of claim 1, further comprising:
   forming the first contact structure based on a mask comprising a first pattern for the first contact structure and a second pattern for forming a second contact structure to a gate layer.

9. The method of claim 1, further comprising:
   forming a second contact structure at a border of an erase block away from array regions of the erase block.

10. The method of claim 1, further comprising:
    forming metal wires that connect the first contact structure with other contact structures to the common source layer, the metal wires being routed away from the array region.

11. The method of claim 1, wherein the substrate is a first substrate of a first die with memory cells formed on a face side of the first die, the method further comprises:
    bonding a second die with the first die, the second die comprising a driving circuit disposed on a face side of the second die, first bonding structures on the face side of the first die and second bonding structures on the face side of the second die being bonded together, the driving circuit being coupled to the first contact structure via at least a first bonding structure and a second bonding structure.

12. The method of claim 11, wherein the method further comprises:
    reducing a thickness of the first die from a back side of the first die opposite to the face side of the first die; and
    forming pad structures on the back side of the first die.

13. The method of claim 12, wherein the method further comprises:
    reducing a thickness of the second die from a back side of the second die opposite to the face side of the second die; and
    forming pad structures on the back side of the second die.

14. A method for fabricating a semiconductor device, comprising:
    forming a first sacrificial layer and a first conductive layer, wherein the first conductive layer is stacked on the first sacrificial layer and directly contacts the first sacrificial layer;
    forming an initial stack of layers over the first conductive layer, the initial stack of layers comprising insulating layers and second sacrificial layers that are stacked alternatingly, wherein the initial stack of layers is stacked on the first conductive layer and directly contacts the first conductive layer;

forming a staircase structure into the initial stack of layers in a staircase region that is adjacent to an array region;

forming a channel structure in the array region, the channel structure comprising a channel layer surrounded by one or more insulating layers and extending through the initial stack of layers, the first conductive layer, and the first sacrificial layer;

replacing the first sacrificial layer with a source layer in connection with the channel layer, the source layer and the first conductive layer forming a common source layer;

replacing the second sacrificial layers with gate layers; and forming a contact structure extending along a stacked direction of the gate layers and the insulating layers, the contact structure being in connection with the common source layer.

15. The method of claim 14, wherein the first conductive layer comprises a metal layer.

16. The method of claim 14, further comprising:
forming a well before forming the first sacrificial layer and the first conductive layer, wherein the first sacrificial layer is disposed on the well.

17. The method of claim 16, wherein the channel structure extends into the well.

18. The method of claim 16, wherein the well comprising N-type doped polysilicon or P-type doped polysilicon.

19. The method of claim 14, further comprising:
forming a step into the first sacrificial layer and the first conductive layer, in the process of forming the staircase structure into the initial stack of layers.

20. The method of claim 14, wherein:
the gate layers and the insulating layers stack alternatingly to form a stack, the stack being divided into blocks by a gate line cut structure across the array region and the staircase region; and the contact structure comprises a first contact structure and a second contact structure, the first contact structure disposed in the staircase region and the second contact structure disposed at a border of one block of the blocks.

* * * * *